United States Patent
Lower et al.

(10) Patent No.: US 8,221,089 B2
(45) Date of Patent: Jul. 17, 2012

(54) THIN, SOLID-STATE MECHANISM FOR PUMPING ELECTRICALLY CONDUCTIVE LIQUIDS IN A FLEXIBLE THERMAL SPREADER

(75) Inventors: Nathan P. Lower, North Liberty, IA (US); Ross K. Wilcoxon, Cedar Rapids, IA (US); James R. Wooldridge, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 937 days.

(21) Appl. No.: 12/283,504

(22) Filed: Sep. 12, 2008

(65) Prior Publication Data

US 2010/0066178 A1    Mar. 18, 2010

(51) Int. Cl.
*F04B 49/06*    (2006.01)
(52) U.S. Cl. .......................... 417/44.1; 310/11
(58) Field of Classification Search ............... 417/44.1, 417/50, 322, 410.1, 420, 505; 310/11
See application file for complete search history.

(56) References Cited

U.S. PATENT DOCUMENTS

| 3,508,974 | A | 4/1970 | Bressler |
| 3,654,528 | A | 4/1972 | Barkan |
| 3,812,404 | A | 5/1974 | Barkan et al. |
| 4,177,015 | A | 12/1979 | Davidson |
| 4,294,658 | A | 10/1981 | Humphreys et al. |
| 4,410,874 | A | 10/1983 | Scapple et al. |
| 4,505,644 | A | 3/1985 | Meisner et al. |
| 4,560,084 | A | 12/1985 | Wolfson |
| 4,572,924 | A | 2/1986 | Wakely et al. |
| 4,622,433 | A | 11/1986 | Frampton |
| 4,761,518 | A | 8/1988 | Butt et al. |
| 4,765,948 | A | 8/1988 | DeLuca et al. |
| 4,773,826 | A | 9/1988 | Mole |
| 4,802,531 | A | 2/1989 | Nathenson et al. |
| 4,882,212 | A | 11/1989 | Singhdeo et al. |

(Continued)

FOREIGN PATENT DOCUMENTS

JP    2003-332505 A    11/2003

OTHER PUBLICATIONS

U.S. Appl. No. 12/284,670, filed Sep. 24, 2008, Cripe et al.

(Continued)

*Primary Examiner* — Toan Ton
*Assistant Examiner* — Andrew Coughlin
(74) *Attorney, Agent, or Firm* — Donna P. Suchy; Daniel M. Barbieri

(57) ABSTRACT

The present invention is a magnetic pump assembly for integration with a mechanically flexible thermal spreader. The assembly may include a casing which may be connectable to a mechanically flexible substrate of the thermal spreader. The assembly may further include a plurality of magnets which may be integrated with and enclosed by the casing. The magnets may be suitable for applying a magnetic field to an electrically-conductive liquid, and may be implemented in combination with electrodes, which may be integrated with the substrate and may be suitable for generating an electrical current flow through the liquid. The magnets and electrodes may combine to provide a pumping force for circulating the liquid within an internal channel of an electrically-conductive cooling loop of the substrate. The assembly may further include a thermally-conductive rigid metal insert integrated with the casing. The assembly may promote local thermal conductivity of the thermal spreader.

19 Claims, 16 Drawing Sheets

U.S. PATENT DOCUMENTS

| | | | |
|---|---|---|---|
| 5,041,342 A | | 8/1991 | Umeda et al. |
| 5,140,109 A | | 8/1992 | Matsumoto et al. |
| 5,184,211 A | | 2/1993 | Fox |
| 5,195,231 A | | 3/1993 | Fanning et al. |
| 5,232,970 A | | 8/1993 | Solc et al. |
| 5,265,136 A | | 11/1993 | Yamazaki et al. |
| 5,315,155 A | | 5/1994 | O'Donnelly et al. |
| 5,665,802 A | * | 9/1997 | Maki et al. .............. 524/141 |
| 5,702,963 A | | 12/1997 | Vu et al. |
| 5,763,951 A | * | 6/1998 | Hamilton et al. .............. 257/714 |
| 5,863,605 A | | 1/1999 | Bak-Boychuk et al. |
| 5,958,794 A | | 9/1999 | Bruxvoort et al. |
| 5,991,351 A | | 11/1999 | Woolley |
| 6,010,956 A | | 1/2000 | Takiguchi et al. |
| 6,019,165 A | | 2/2000 | Batchelder |
| 6,021,844 A | | 2/2000 | Batchelder |
| 6,110,656 A | | 8/2000 | Eichorst et al. |
| 6,121,175 A | | 9/2000 | Drescher et al. |
| 6,159,910 A | | 12/2000 | Shimizu et al. |
| 6,423,415 B1 | | 7/2002 | Greene et al. |
| 6,586,087 B2 | | 7/2003 | Young |
| 6,658,861 B1 | | 12/2003 | Ghoshal et al. |
| 6,665,186 B1 | | 12/2003 | Calmidi et al. |
| 6,708,501 B1 | | 3/2004 | Ghoshal et al. |
| 6,798,072 B2 | | 9/2004 | Kajiwara et al. |
| 6,918,984 B2 | | 7/2005 | Murray et al. |
| 7,078,263 B2 | | 7/2006 | Dean |
| 7,131,286 B2 | | 11/2006 | Ghoshal et al. |
| 7,176,564 B2 | | 2/2007 | Kim |
| 7,293,416 B2 | | 11/2007 | Ghoshal |
| 7,296,417 B2 | | 11/2007 | Ghoshal |
| 7,297,206 B2 | | 11/2007 | Naruse et al. |
| 7,340,904 B2 | | 3/2008 | Sauciuc et al. |
| 7,342,787 B1 | | 3/2008 | Bhatia |
| 7,348,665 B2 | | 3/2008 | Sauciuc et al. |
| 7,391,060 B2 | | 6/2008 | Oshio |
| 7,423,874 B2 | * | 9/2008 | Ouyang .............. 361/699 |
| 7,491,431 B2 | | 2/2009 | Chiruvolu et al. |
| 7,692,259 B2 | | 4/2010 | Suehiro |
| 7,737,356 B2 | | 6/2010 | Goldstein |
| 2001/0015443 A1 | | 8/2001 | Komoto |
| 2002/0000630 A1 | | 1/2002 | Coyle |
| 2002/0054976 A1 | | 5/2002 | Nakamura et al. |
| 2002/0078856 A1 | | 6/2002 | Hahn et al. |
| 2002/0134529 A1 | * | 9/2002 | Nozaki et al. .............. 165/51 |
| 2002/0170173 A1 | | 11/2002 | Mashino |
| 2002/0189495 A1 | | 12/2002 | Hayashi et al. |
| 2002/0189894 A1 | | 12/2002 | Davis et al. |
| 2003/0047735 A1 | | 3/2003 | Kyoda et al. |
| 2003/0080341 A1 | | 5/2003 | Sakano et al. |
| 2003/0228424 A1 | | 12/2003 | Dove et al. |
| 2004/0106037 A1 | | 6/2004 | Cho et al. |
| 2004/0116577 A1 | | 6/2004 | Naruse et al. |
| 2004/0156995 A1 | | 8/2004 | Komiyama et al. |
| 2005/0003947 A1 | | 1/2005 | Mazany et al. |
| 2005/0082691 A1 | | 4/2005 | Ito et al. |
| 2005/0099775 A1 | | 5/2005 | Pokharna et al. |
| 2005/0179742 A1 | | 8/2005 | Keenan et al. |
| 2006/0045755 A1 | | 3/2006 | McDonald et al. |
| 2006/0068218 A1 | | 3/2006 | Hooghan et al. |
| 2006/0158849 A1 | | 7/2006 | Martin et al. |
| 2006/0249279 A1 | * | 11/2006 | Chordia et al. .............. 165/80.4 |
| 2006/0250731 A1 | | 11/2006 | Parkhurst et al. |
| 2006/0268525 A1 | | 11/2006 | Jeong |
| 2006/0283546 A1 | | 12/2006 | Tremel et al. |
| 2007/0075323 A1 | | 4/2007 | Kanazawa et al. |
| 2007/0224400 A1 | | 9/2007 | Meguro et al. |
| 2008/0006204 A1 | | 1/2008 | Rusinko et al. |
| 2008/0050512 A1 | | 2/2008 | Lower et al. |
| 2008/0063875 A1 | | 3/2008 | Robinson et al. |
| 2009/0246355 A9 | | 10/2009 | Lower et al. |

OTHER PUBLICATIONS

U.S. Appl. No. 12/283,563, filed Sep. 12, 2008, Lower et al.
U.S. Appl. No. 12/283,502, filed Sep. 12, 2008, Wilcoxon et al.
U.S. Appl. No. 12/283,501, filed Sep. 12, 2008, Wilcoxon et al.
U.S. Appl. No. 11/959,225, filed Dec. 18, 2007, Lower et al.
U.S. Appl. No. 11/784,158, filed Apr. 5, 2007, Lower et al.
U.S. Appl. No. 11/732,981, filed Apr. 5, 2007, Wilcoxon et al.
Bonding and Coating Applications of PQ® Soluble Silicates, Bulletin 12-31, PQ Corporation, 2003, 7 pages.
PQ® Soluble Silicates in Refractory and Chemical-Resistant Cements, Bulletin 24-1, PQ Corporation, 2003, 6 pages.
Click et al., SCHOTT Low Temperature Bonding for Precision Optics, 20 pages.
Technical Standard Order, TSO-C115b, Airborne Area Navigation Equipment Using Multi-Sensor Inputs, Sep. 30, 1994, 11 pages, Department of Transportation, Federal Aviation Administration, Washington, DC.
Techpowerup, NanoCoolers puts liquid metal in your PC, May 4, 2005, 19 pages.
Thresh, The Action of Natural Waters on Lead, The Analyst, Proceedings of the Society of Public Analysts and Other Analytical Chemists, Nov. 1922, pp. 459-468, vol. XLVII, No. 560.
Notice of Allowance for U.S. Appl. No. 12/284,670, mail date May 11, 2011, 7 pages.
Office Action for U.S. Appl. No. 12/284,670, mail date Feb. 17, 2011, 13 pages.
Office Action for U.S. Appl. No. 12/116,126, mail date Feb. 25, 2011, 9 pages.
Office Action for U.S. Appl. No. 12/116,126, mail date May 10, 2011, 8 pages.
Office Action for U.S. Appl. No. 12/116,126, mail date Apr. 22, 2010, 7 pages.
Office Action for U.S. Appl. No. 12/284,670, mail date Sep. 28, 2010, 11 pages.
Office Action for U.S. Appl. No. 12/116,126, mail date Oct. 25, 2010, 9 pages.
U.S. Appl. No. 11/508,782, Nathan P. Lower, et al.
U.S. Appl. No. 11/732,982, Alan P. Boone, et al.
U.S. Appl. No. 12/116,126, Nathan P. Lower, et al.
International Search Report and Written Opinion for Application No. PCT/US2009/036355, mail date Jun. 30, 2009, 11 pages.
Office Action for U.S. Appl. No. 12/116,126, mail date Nov. 20, 2009, 7 pages.

* cited by examiner

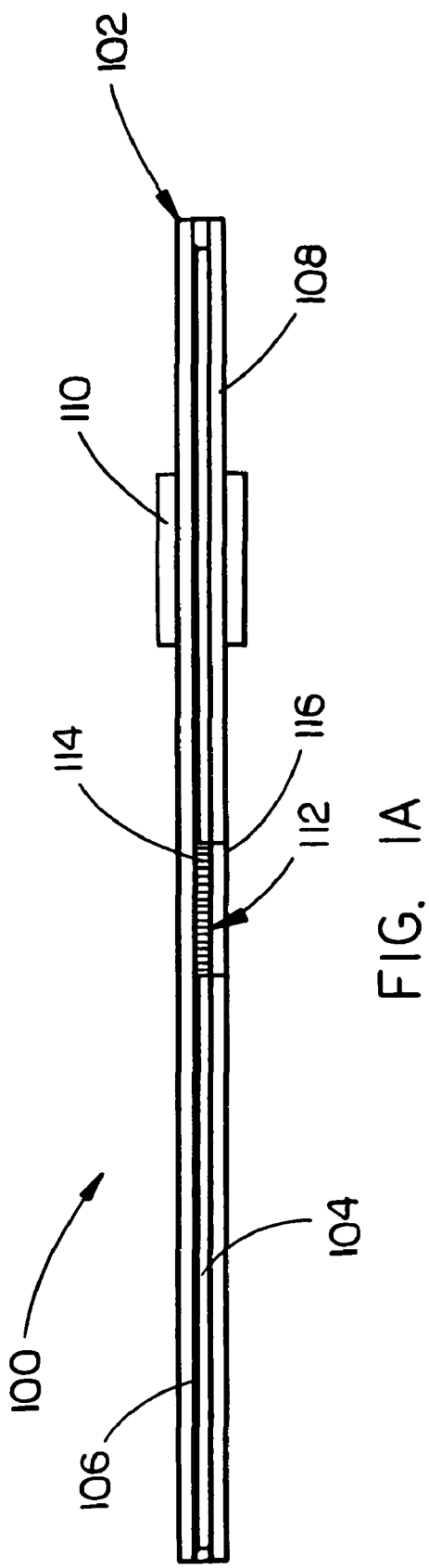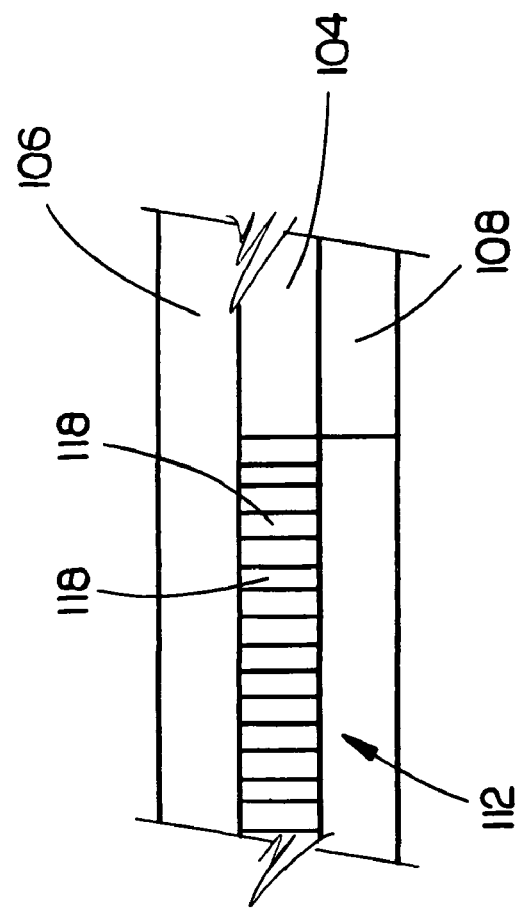
FIG. 1A
FIG. 1B

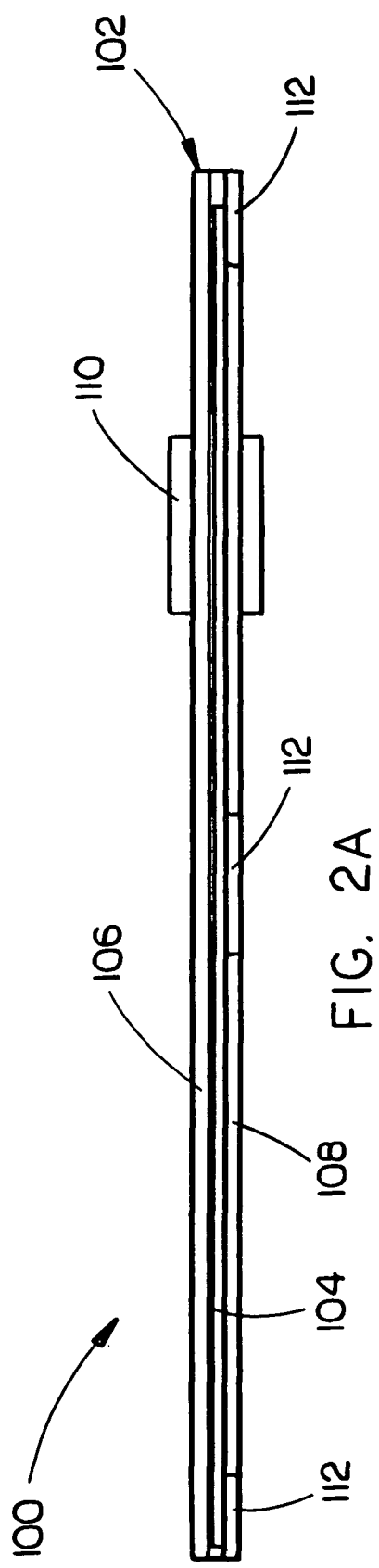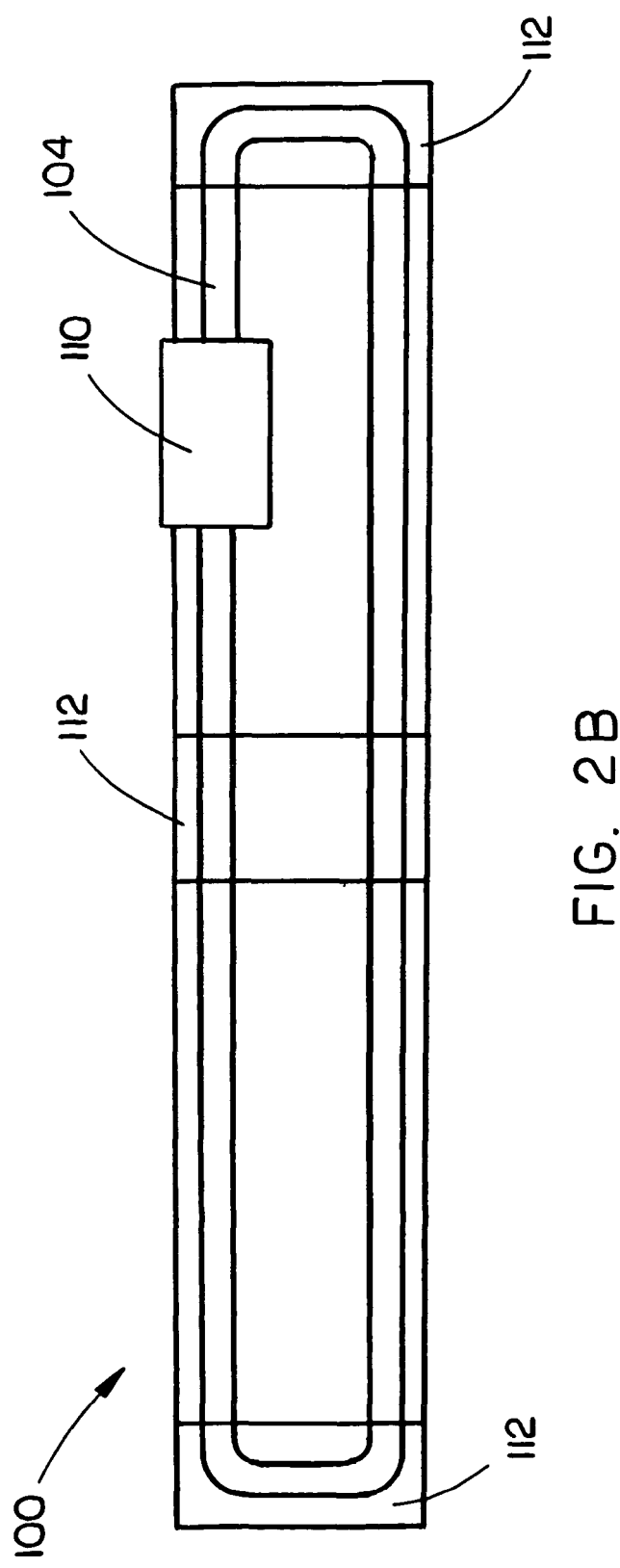
FIG. 2A
FIG. 2B

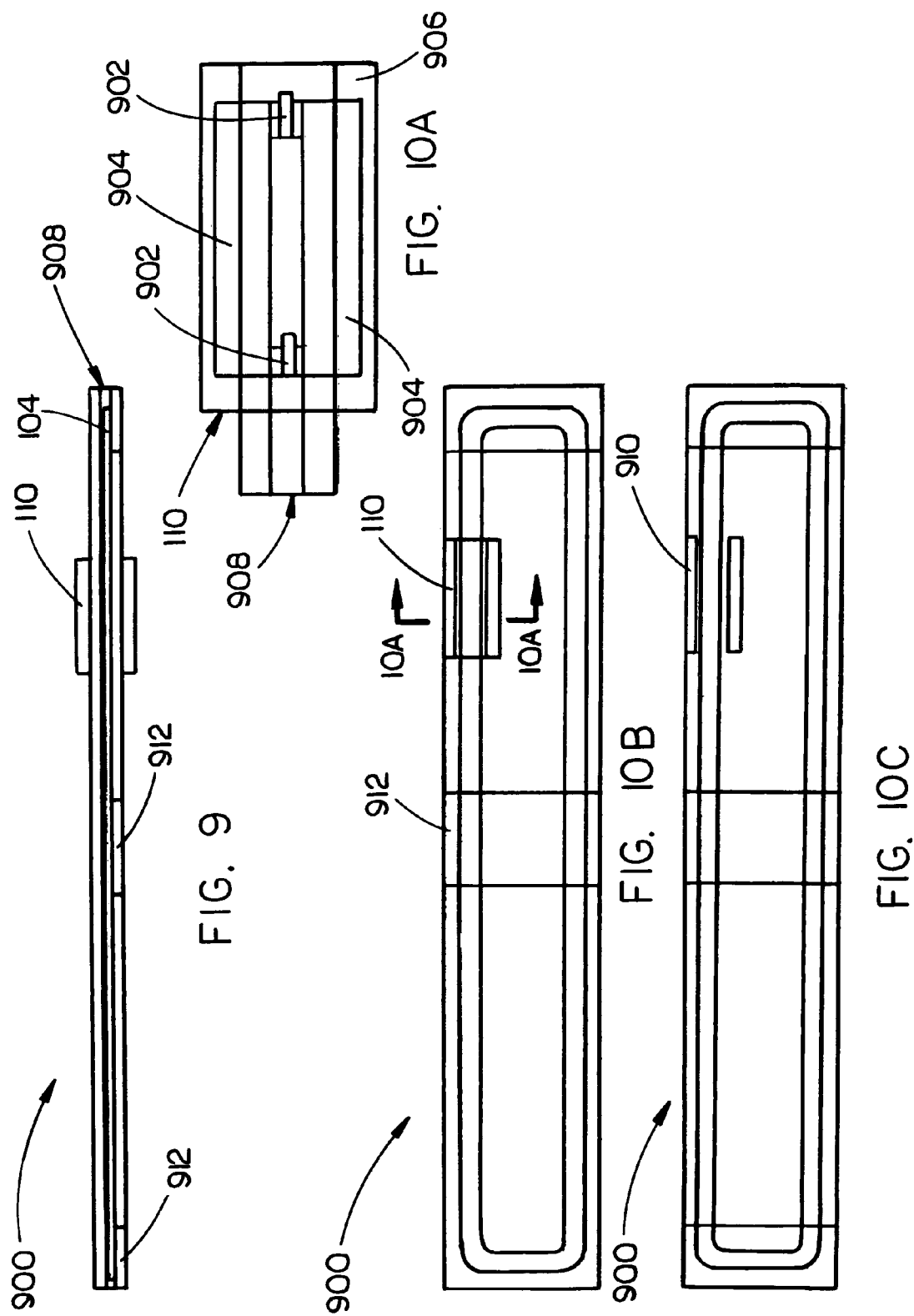

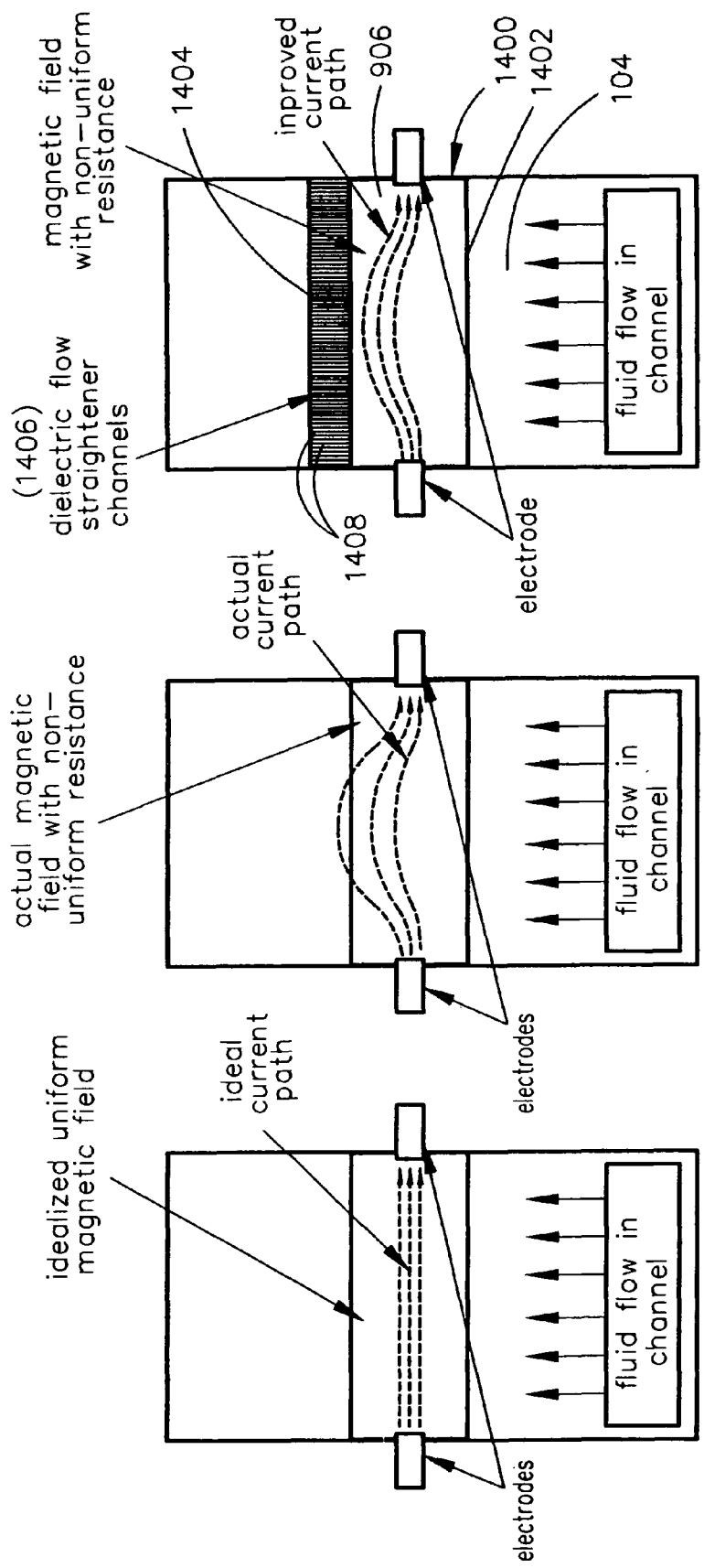

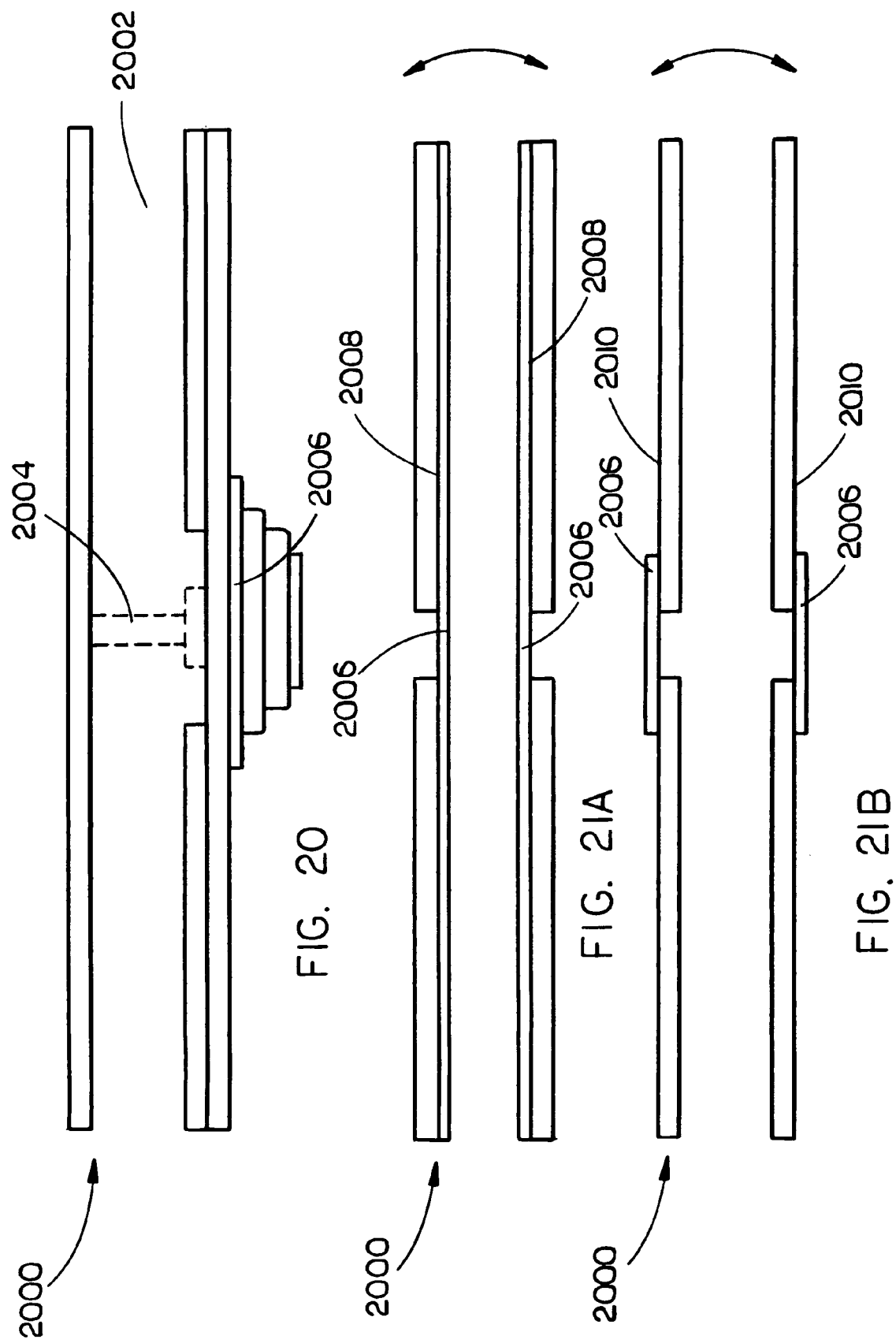

THIN, SOLID-STATE MECHANISM FOR PUMPING ELECTRICALLY CONDUCTIVE LIQUIDS IN A FLEXIBLE THERMAL SPREADER

CROSS-REFERENCE

The following patent applications are incorporated by reference in their entireties:

| Express Mail No. | Filing Date | Ser. No. |
| --- | --- | --- |
| EM 210498679 US | Sep. 12, 2008 | 12/283,563 |
| EM 210498665 US | Sep. 12, 2008 | 12/283,501 |
| EM 210498696 US | Sep. 12, 2008 | 12/283,502 |

Further, U.S. patent application Ser. No. 12/116,126 entitled: System and Method for a Substrate with Internal Pumped Liquid Metal for Thermal Spreading and Cooling, filed May 6, 2008, (pending); U.S. patent application Ser. No. 11/508,782 entitled: Integrated Circuit Protection and Ruggedization Coatings and Methods filed Aug. 23, 2006, (pending); and U.S. patent application Ser. No. 11/732,982 entitled: A Method For Providing Near-Hermetically Coated Integrated Circuit Assemblies filed Apr. 5, 2006 (pending) are also hereby incorporated by reference in their entirety herein.

FIELD OF THE INVENTION

The present invention relates to the field of thermal management and particularly to a thin, solid-state mechanism for pumping electrically conductive liquids in a mechanically flexible thermal spreader.

BACKGROUND OF THE INVENTION

Currently mechanisms for pumping/circulating electrically conductive liquids in cooling loops may not provide a desired level of performance.

Thus, it would be desirable to provide a pumping mechanism which addresses the shortcomings of currently available solutions.

SUMMARY OF THE INVENTION

Accordingly, an embodiment of the present invention is directed to a magnetic pump for integration with a mechanically flexible thermal spreader, said magnetic pump including: a casing, the casing configured for being connected to a mechanically flexible substrate of the thermal spreader; and a plurality of magnets, the plurality of magnets configured for being integrated with and at least partially enclosed by the casing, the plurality of magnets configured for applying a magnetic field to an electrically-conductive liquid, said magnets further configured for implementation with a plurality of electrodes, said electrodes being integrated within the mechanically flexible substrate for generating an electrical current flow through said liquid via a voltage applied across said electrodes, said magnets, in combination with said electrodes, configured for providing a pumping force for circulating the electrically-conductive liquid within an internal channel of an electrically-conductive cooling loop of the mechanically flexible substrate for promoting thermal conductivity of the thermal spreader.

An additional embodiment of the present invention is directed to a magnetic pump assembly for integration with a mechanically flexible thermal spreader, said magnetic pump assembly including: a casing, the casing configured for being connected to a mechanically flexible substrate of the thermal spreader; a plurality of magnets, the plurality of magnets configured for being integrated with and at least partially enclosed by the casing, the plurality of magnets configured for applying a magnetic field to an electrically-conductive liquid, said magnets further configured for implementation with a plurality of electrodes, said electrodes being integrated within the mechanically flexible substrate for generating an electrical current flow through said liquid via a voltage applied across said electrodes, said magnets, in combination with said electrodes, configured for providing a pumping force for circulating the electrically-conductive liquid within an internal channel of an electrically-conductive cooling loop of the mechanically flexible substrate; and a rigid metal insert, the rigid metal insert configured for being integrated with the casing, wherein said assembly is configured for promoting local thermal conductivity of the thermal spreader.

A further embodiment of the present invention is directed to a magnetic pump for integration with a mechanically flexible thermal spreader, said magnetic pump including: a casing, the casing configured for being connected to a mechanically flexible substrate of the thermal spreader; a plurality of magnets, the plurality of magnets configured for being integrated with and at least partially enclosed by the casing, the plurality of magnets configured for applying a magnetic field to an electrically-conductive liquid, said magnets further configured for implementation with a plurality of electrodes, said electrodes being integrated within the mechanically flexible substrate for generating an electrical current flow through said liquid via a voltage applied across said electrodes, said magnets, in combination with said electrodes, configured for providing a pumping force for circulating the electrically-conductive liquid within an internal channel of an electrically-conductive cooling loop of the mechanically flexible substrate for promoting thermal conductivity of the thermal spreader, wherein the casing is configured with an input port and an output port, the casing being configured with a plurality of magnet flow channels, said magnet flow channels being located proximal to the output port, said magnet flow channels being further configured for allowing the electrically-conductive liquid to flow through the pump in a first direction, said casing being further configured with a plurality of channel walls, said channel walls configured for separating the magnet flow channels, said channel walls being configured for preventing the generated electrical current flow through said liquid from flowing in a direction generally perpendicular to the first direction, thereby promoting pumping power efficiency of the magnetic pump.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1A is a side elevation view of a thermal spreader in accordance with an exemplary embodiment of the present invention;

FIG. 1B is a sectional view of the thermal spreader of FIG. 1A, said sectional view showing in enlarged detail extension portions of an insert of the thermal spreader in accordance with an exemplary embodiment of the present invention;

FIG. 2A is a side elevation view of a thermal spreader in accordance with an exemplary embodiment of the present invention;

FIG. 2B is a bottom plan cross-sectional view of the thermal spreader shown in FIG. 2A in accordance with an exemplary embodiment of the present invention.

FIG. 9 is a side elevation view of a thin, mechanically flexible thermal spreader which implements/includes a magnetic pump in accordance with an exemplary embodiment of the present invention;

FIG. 10A is a cross-sectional view of a magnetic pump integrated with a mechanically flexible substrate of a thin, mechanically flexible thermal spreader in accordance with an exemplary embodiment of the present invention;

FIG. 10B is a bottom plan cross-sectional view of the thermal spreader shown in FIG. 9, said view showing a bottom surface of the ferrous casing/ferrous lens of the magnetic pump implemented/integrated with said thermal spreader in accordance with an exemplary embodiment of the present invention;

FIG. 10C is a bottom plan cross-sectional view as in FIG. 10 B except that said magnetic pump has been removed to illustrate a slotted portion of the mechanically flexible substrate of the thermal spreader, said slotted portion configured for receiving the magnetic pump in accordance with an exemplary embodiment of the present invention;

FIG. 12 is a cutaway view of a magnetic pump integrated with an internal channel of a thermal spreader, said view illustrating a flow direction of electrically-conductive liquid through the internal channel and magnetic pump, said view further illustrating an ideal electrical current flow/current path relative to said liquid flow direction, said current flow generated via said electrodes of the thermal spreader;

FIG. 13 is a cutaway view of a magnetic pump integrated with an internal channel of a thermal spreader, said view illustrating a flow direction of electrically-conductive liquid through the internal channel and magnetic pump, said view further illustrating a curved electrical current flow/current path relative to said liquid flow direction, said current flow generated via said electrodes of the thermal spreader;

FIG. 14 is a cutaway view of a magnetic pump in accordance with an exemplary embodiment of the present invention, integrated with an internal channel of a liquid cooling loop of a mechanically flexible substrate of a thin mechanically flexible thermal spreader, said magnetic pump including a plurality of magnet flow channels/dielectric flow straightener channels separated by channel walls, said view further illustrating a current path produced when said magnetic pump of the present invention is implemented as shown;

FIG. 20 is a sectional view of an internal channel of a mechanically flexible substrate of a thermal spreader, said internal channel connected to an expandable bladder, said internal channel including a wall (shown in phantom-line view) for directing fluid flow within the channel towards said bladder in accordance with a further exemplary embodiment of the present invention;

FIG. 21A is a sectional view of an internal channel of a mechanically flexible substrate of a thermal spreader in which the expandable bladder is placed on an interior wall of the internal channel in accordance with an exemplary embodiment of the present invention;

FIG. 21B is a sectional view of an internal channel of a mechanically flexible substrate of a thermal spreader in which the expandable bladder is placed on an exterior wall of the internal channel in accordance with an alternative exemplary embodiment of the present invention;

DETAILED DESCRIPTION OF THE INVENTION

Figure 3:
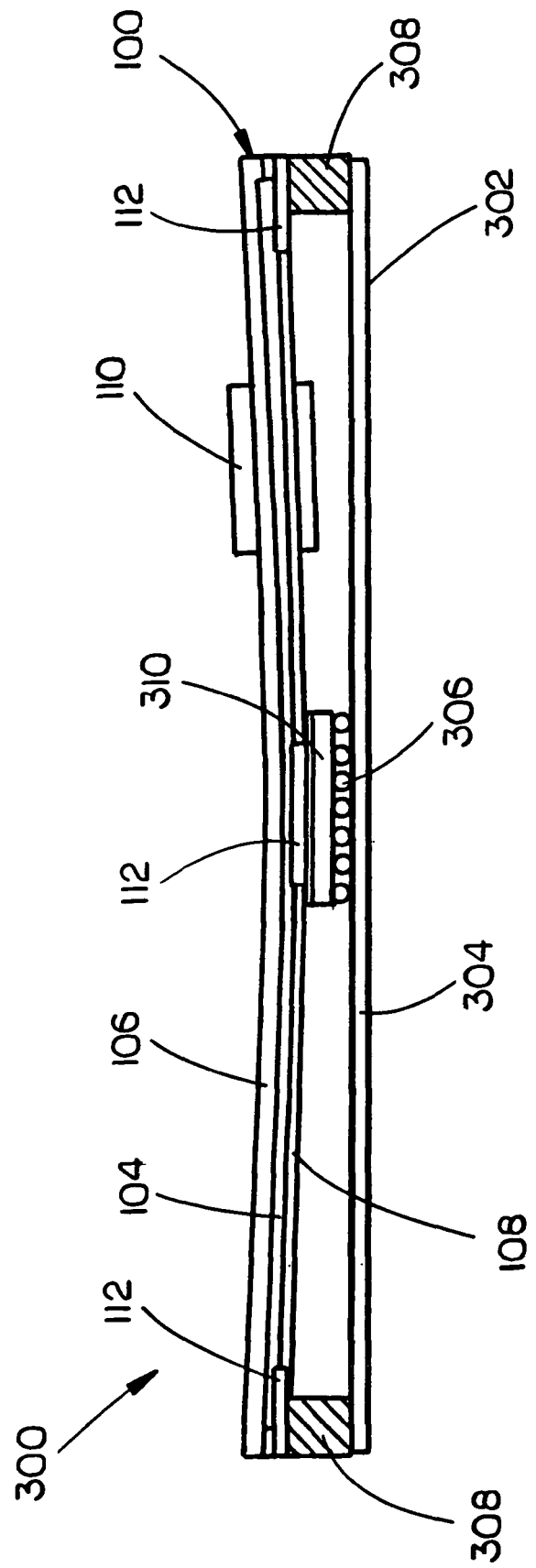
FIG. 3 is a side elevation view of a thermal spreader assembly in accordance with an exemplary embodiment of the present invention.

Reference will now be made in detail to the presently preferred embodiments of the invention, examples of which are illustrated in the accompanying drawings.

A thermal spreader/heat spreader may be used to diffuse and transport thermal energy from a heat source, such as an electronics component on a circuit board, to a lower temperature surface, such as a chassis in which the circuit board may be mounted. A heat spreader may be constructed of a material having a high thermal conductivity, such as metal (ex.—copper, aluminum), in order to reduce thermal gradients within the heat spreader so that the heat spreader may minimize the temperature of the heat source. When thermal gradients within a heat spreader are excessive, inserts (ex.—heat pipes, pyrolytic graphite inserts) having high effective thermal conductivities may be integrated with/into the heat spreader to offer/provide improved thermal paths.

Because of their structural properties, metal heat spreaders may be rigid (ex.—mechanically inflexible). Due to tolerance uncertainties which may be associated with an assembly that includes a heat spreader, a chassis, and a circuit board, the heat spreader of said assembly may be designed for some tolerance stack-up in order to prevent subjecting an electronics component (which may be connected to the circuit board) to forces which may be generated by a tight or interference fit between the heat spreader and the electronics component. Alternatively, a non-metal heat spreader may be implemented and may provide improved mechanical flexibility compared to a metal heat spreader. However, a non-metal heat spreader may have an extremely low thermal conductivity relative to a metal heat spreader, and thus, may not be a suitable option.

The rigid, metal heat spreader may also be implemented with a compliant thermal gap filler/thermal interface material. The thermal interface material may be placed between the metal heat spreader and an electronics component to ensure that a non-air conduction path exists between a surface of the metal heat spreader and a surface of the electronics component. The thermal interface material/compliant material may generally be organic-based and may have a thermal conductivity which may be approximately two orders of magnitude lower than the thermal conductivity of the metal of the metal heat spreader. Thus, the thermal interface material may contribute a significant portion of an overall thermal resistance path between the electronics component and an ambient environment.

A number of basic metals which may be used in metal heat spreaders may have thermal conductivities of about 100-400 Watts/meters • Kelvin (W/mK). Heat pipes and exotic materials, such as graphite and diamond, which may be integrated with heat spreaders may exhibit effective thermal conductivities of up to approximately ten times greater than 100-400 (W/mK). As power dissipation from electronic components continues to increase, it may be desirable to construct heat spreaders/to implement thermal spreading technologies which provide higher effective thermal conductivities. However, the suitability for use of certain materials when constructing heat spreaders/implementing thermal spreading technologies may be limited by factors such as heat flux limits (ex.—for heat pipes), orthotropic properties (ex.—of graphite), or cost (ex.—of diamond). Therefore, it may be desirable to implement a heat spreader technology which produces/provides a heat spreader that is: a.) mechanically flexible; b) has an effective thermal conductivity which is significantly higher than the effective thermal conductivities of currently available rigid, metal heat spreaders or heat pipe assemblies; and c.) has heat flux limits which are significantly higher than the heat flux limits of currently available rigid, metal heat spreaders or heat pipe assemblies.

Referring generally to FIGS. 1A through 2B, a heat spreader/thermal spreader in accordance with an exemplary embodiment of the present invention is shown. The thermal spreader 100 may include a mechanically flexible substrate 102. In exemplary embodiments, the substrate 102 may be at least partially (ex.—primarily) constructed/fabricated of flexible or mechanically compliant materials. For example, the substrate 102 may be at least partially constructed of organic materials. Further, the substrate 102 may be at least partially constructed of organic-inorganic composite materials which may include glass, ceramics, carbon, metal reinforcements, thin metallic sheets, molded plastic materials, standard circuit board materials, flexible circuit board materials, rigid-flex circuit cards, and/or the like. Constructing the substrate 102 at least partially of organic materials (rather than constructing a thermal spreader entirely of metal) may provide a thermal spreader 100 which is mechanically flexible, lightweight and low cost.

As described above, because the mechanically flexible substrate 102 of thermal spreader 100 is made of/includes regions of a compliant material, it may be sufficiently flexible so that it may bend and thereby make up much if not all of any dimensional gaps between a heat source/heat source region and a heat sink/heat sink region due to tolerance stack-up, thermal expansion effects, vibration, etc. For instance, the substrate 102 of the thermal spreader 100 may be configured to bend to a sufficient degree such that it may contact two or more surfaces that have a varying mechanical separation in a direction perpendicular to a plane of the substrate 102 due to tolerance stackup, vibration, thermal expansion, etc. Such flexibility of the substrate 102 of the thermal spreader 100 may promote a reduced need for utilizing compliant thermal gap filling materials (ex.—thermal pads, gels) that may otherwise be needed to provide compliance, said compliant thermal gap filling materials also typically representing a significant thermal resistance.

In further embodiments, the mechanically flexible substrate 102 may form at least one internal channel/flow channel 104. The internal channel 104 may be configured for containing an electrically-conductive liquid. In exemplary embodiments, the internal channel 104 may provide for/may allow closed-loop flow of the electrically-conductive liquid (ex.—the internal channel 104 may be/may include an internal/embedded cooling loop). In exemplary embodiments, the electrically-conductive liquid may be/may include a liquid metal and/or a liquid metal alloy. For example, the liquid metal alloy may include at least two of the following: Gallium, Indium, Tin, Zinc, Lead and Bismuth. For instance, the liquid metal alloy may be a Gallium-Indium-Tin eutectic known as Galinstan. In further embodiments, the electrically-conductive liquid may include a metal having a melting temperature of less than fifty (50) degrees Celsius. In additional embodiments, the substrate 102 may include one or more mechanically compliant layers, such as a first mechanically compliant layer 106 and a second mechanically compliant layer 108. Further, the internal channel/internal cooling loop 104 may be formed by/formed between/embedded between the first compliant layer 106 and the second compliant layer 108.

In current embodiments of the present invention, the thermal spreader 100 may further include a mechanism for circulating the electrically-conductive liquid/fluid, such as at least one pump 110. The pump 110 may be configured for being connected to/integrated with the substrate 102. The pump 110 may be further configured for circulating the flow of/moving the electrically-conductive liquid within the internal channel 104 so that the thermal spreader 100 may provide a high effective thermal conductivity between heat source(s) (ex.—electronics component(s) on a circuit board) to which the thermal spreader 100 may be connected/attached, and heat sink(s) (ex.—a chassis/chassis rail(s) in/on which the electronics component/circuit board may be mounted) to which the thermal spreader 100 may be connected/attached. In this way, the thermal spreader 100 may be configured for directing thermal energy from the heat source to the heat sink via the electrically-conductive liquid. In exemplary embodiments, the pump 110 may be a piezoelectric positive displacement pump, an inductive pump, a magnetic pump (ex.—a solid state magnetic pump), or the like.

In further embodiments, the thermal spreader 100 may include one or more localized, high thermal conductivity/thermally-conductive, rigid metal inserts 112. Each insert 112 may be configured for being connected to/integrated with/received by (ex.—such as via slots formed by the substrate)/placed within the mechanically flexible substrate 102 such that the insert 112 may be in thermal contact with the electrically-conductive liquid and the substrate 102. Further, each insert 112 may be further configured for promoting heat transfer between the thermal spreader 100 and the electrically-conductive liquid (ex.—for promoting thermal energy transfer/local heat transfer to/into and from/out of the electrically-conductive liquid/coolant). In additional embodiments, each insert 112 may include a first surface 114 and a second surface 116, the first surface 114 being located generally opposite the second surface 116. The first surface/internal surface 114 may be configured for being oriented toward the internal channel 104 (ex.—oriented so as to physically contact the electrically-conductive liquid). The second surface/external surface 116 may be configured for being oriented away from the internal channel 104 (ex.—oriented so as to not physically contact the liquid).

In current embodiments of the present invention, the first surface 114 of each insert 112 may be configured with one or more mechanical features/fine features/roughened areas/machined areas/extended surfaces/extension portions 118. The extension portions 118 may promote thermal energy transfer between the insert 112 and the electrically-conductive liquid by providing increased or additional contact surface area/thermal contact area/convective heat transfer area, thereby reducing convective thermal resistance between the insert 112 and the liquid. The insert 112 may be fabricated with the extension portions 118 via manufacturing processes, such as machining, extrusion, chemical etching, or the like. For instance, the extension portions 118 may be fins, pins, or plates which may be aligned with a direction of flow of the liquid, or said extension portions 118 may be other suitable geometries for increasing the heat transfer area of the insert 112 and/or for creating localized turbulence to provide higher levels of heat transfer. The fine features/roughened areas/extension portions 118 may be produced via machining, roughening, machining extrusion, chemical etching, molding or other like processes. Further, the extension portions 118 of the inserts 112 may allow the inserts 112 to provide structural support for the compliant layers (106, 108) of the mechanically flexible substrate 102, said compliant layers (106, 108) sandwiching or being positioned on each side of (ex.—above and below) the internal channel 104. In still further embodiments, the second surface/external surface 116 of the insert 112 may be smooth for promoting minimization of contact resistance.

In further embodiments, each insert 112 may be at least partially constructed of/may be integrated with thermally-conductive foam, an array of carbon nanotubes, high thermal-conductivity filaments, and/or the like, for providing additional heat transfer surfaces/thermal enhancements for the thermal spreader 100. For example, the thermally-conductive foam may be a graphite foam, a graphite alloy foam, and/or a copper alloy foam.

When implementing/during application of electrically conductive liquid cooling (such as via the internal channel 104/cooling loop described above), a possible limiting issue may be the potential for chemical/metallurgical interactions between metals of/within the thermal spreader 100 and the liquid. In order to maximize thermal performance of the thermal spreader 100, it may be imperative that the electrically-conductive liquid have good thermal contact with the metal inserts 112 of/within the thermal spreader 100. However, metallurgical or chemical interactions between metal(s) of the thermal spreader 100 (ex.—metals of the substrate 102 and/or the inserts 112) and the electrically-conductive liquid may lead to corrosion of said metal(s) of the thermal spreader 100 into the liquid, which may result in changes in the properties of the liquid. If the liquid is a metal alloy, additional metals which corrode into the liquid may result in the formation of a new metal alloy in the liquid. This new metal alloy may be highly corrosive and/or may include a high melting temperature metal. For example, when Gallium-containing alloys are brought into contact with Aluminum, the Gallium may rapidly diffuse into the Aluminum, thereby resulting in the formation of a highly corrosive alloy, particularly when in the presence of moisture. Further, Gallium, Indium and Tin may tend to have high diffusion coefficients into metals such as Gold, Copper, and Silver, which may result in the production of high melting temperature alloys upon diffusion and alloy formation.

A possible solution to the above-referenced problem may involve applying/plating Nickel to the thermal spreader 100 (ex.—to the metal inserts 112 of the thermal spreader 100) to protect the thermal spreader 100 from corrosion. However, this solution may be expensive, the Nickel may represent a thermal resistance, and the Nickel may still react with the liquid. A further possible solution may involve evaporation/sputtering/chemical vapor deposition/plating of materials such as Tantalum, Tungsten, other inorganic coatings, and/or organic coatings (ex.—Parylene) onto the thermal spreader 100 via a vapor deposition process(es). Although application of such materials may provide a suitable barrier, said vapor deposition processes using said materials may be expensive and/or complicated to perform. The present invention addresses the above-referenced problem by providing a thermal spreader 100 which may have a protective barrier between the electrically-conductive liquid and metal surfaces of the thermal spreader 100 (ex.—metal portions of the flexible substrate which may contact/may otherwise contact said liquid, the surfaces of the metal inserts 112 which may contact/may otherwise contact said liquid). Further, the protective barrier/coating provided by the present invention may be a non-metallic coating (ex.—alkali silicate glass) that is extremely thin, provides minimal thermal resistance, while providing superior long term protection/preventing electrochemical reactions between metal surfaces of the thermal spreader 100 and the electrically-conductive liquid.

In exemplary embodiments, the first surface/internal surface 114 (ex.—the surface oriented toward/more proximal to/so as to contact the liquid) of each insert 112 may be at least partially coated with one or more layers of a protective coating, such as alkali silicate glass. For example, a layer included in the one or more layers of alkali silicate glass may have a thickness value ranging between and including the values of 0.1 microns and 10.0 microns. In additional embodiments, other surfaces/portions of the thermal spreader 100 (ex.—fine features on the interior/first surface 114 of each insert 112, such as the extension portions 118, which may be configured for being positioned/located at heat source and heat sink locations) may also be at least partially coated with the protective alkali silicate glass coating. The alkali silicate glass of the present invention may have one or more of a number of various compositions, including but not limited to those compositions described in U.S. patent application Ser. No. 11/732,982, filed on Apr. 5, 2007, entitled: "A Method For Providing Near-Hermetically Coated Integrated Circuit Assemblies"; U.S. patent application Ser. No. 11/508,782, filed on Aug. 23, 2006, entitled: "Integrated Circuit Protection and Ruggedization Coatings and Methods"; and/or U.S. patent application Ser. No. 12/116,126, filed on May 6, 2008, entitled: "System and Method for a Substrate with Internal Pumped Liquid Metal for Thermal Spreading and Cooling", which are herein incorporated by reference.

In exemplary embodiments of the present invention, the alkali silicate glass (ASG) layers may be easily deposited implementing standard atmosphere/near room temperature processes, thereby allowing for low recurring cost/low capital investment processing methods. For instance, the alkali silicate glass may be applied by spraying one or more layers of the material/ASG onto the thermal spreader 100 via an Asymtek® jetting system and an appropriate spray head. Alternatively, the alkali silicate glass coating may be applied by flooding the internal channel(s) 104 with a solution of the ASG coating and then utilizing forced air to remove any excess ASG coating/solution. In further embodiments, appropriately passivated electrodes (ex.—electrodes coated with/constructed entirely of a passivation metal such as Tungsten, Tantalum, or Nickel) may be inserted into/integrated with the mechanically flexible substrate 102 post-treatment (ex.—after the ASG coating is applied). Still further, the electrodes may be constructed of graphite or another properly coated metal, such as Tantalum, Tungsten, or Nickel. The electrodes may be configured for generating an electrical current flow through the electrically-conductive liquid via an applied voltage to said electrodes. In further embodiments, the thermal spreader 100/surfaces of the thermal spreader which may contact the electrically-conductive liquid may be at least partially coated with a substance which may improve wetting characteristics for the liquid.

As mentioned above, the thermal spreader 100 of the present invention may be configured for providing a high effective thermal conductivity between a heat source and a heat sink. The thermal spreader 100 may be implemented in a variety of applications. For example, the thermal spreader 100 of the present invention may be implemented as part of a thermal spreader assembly 300 as shown in FIG. 3. In exemplary embodiments, the thermal spreader assembly 300 may include a heat source, such as a conduction-cooled circuit card assembly 302. The conduction-cooled circuit card assembly 302 may include a circuit card 304. The circuit card assembly 302 may further include an electronic component 306 mounted on the circuit card 304. The circuit card assembly 302 may further include a plurality of mechanical mounting fixtures (ex.—wedge locks, card guides, etc.) 308 mounted on said circuit card 304. The thermal spreader assembly 300 may further include a thermal spreader 100 as described above. The thermal spreader 100 may be configured for being thermally connected to the circuit card 304 and the electronic component 306, such as via a layer of thermal adhesive 310. The thermal spreader 100 may be further configured for being thermally connected to a heat sink, such as a chassis/electronics housing, by being mounted in the chassis (ex.—on rails of the chassis) via the mechanical mounting fixtures/mounting feature(s) 308. The thermal spreader 100 is configured for providing thermal conductivity between the heat source (ex.—the electronic component 306) and the heat sink (ex.—the chassis). The mechanical compliance of the thermal spreader 100 of the present invention may allow for a thermal spreader assembly 300 which has a reduced need for thermal gap filler, is lighter weight and lower in cost than thermal spreader assemblies which implement a mechanically rigid thermal spreader (ex.—a thermal spreader constructed entirely of metal).

Figure 4:
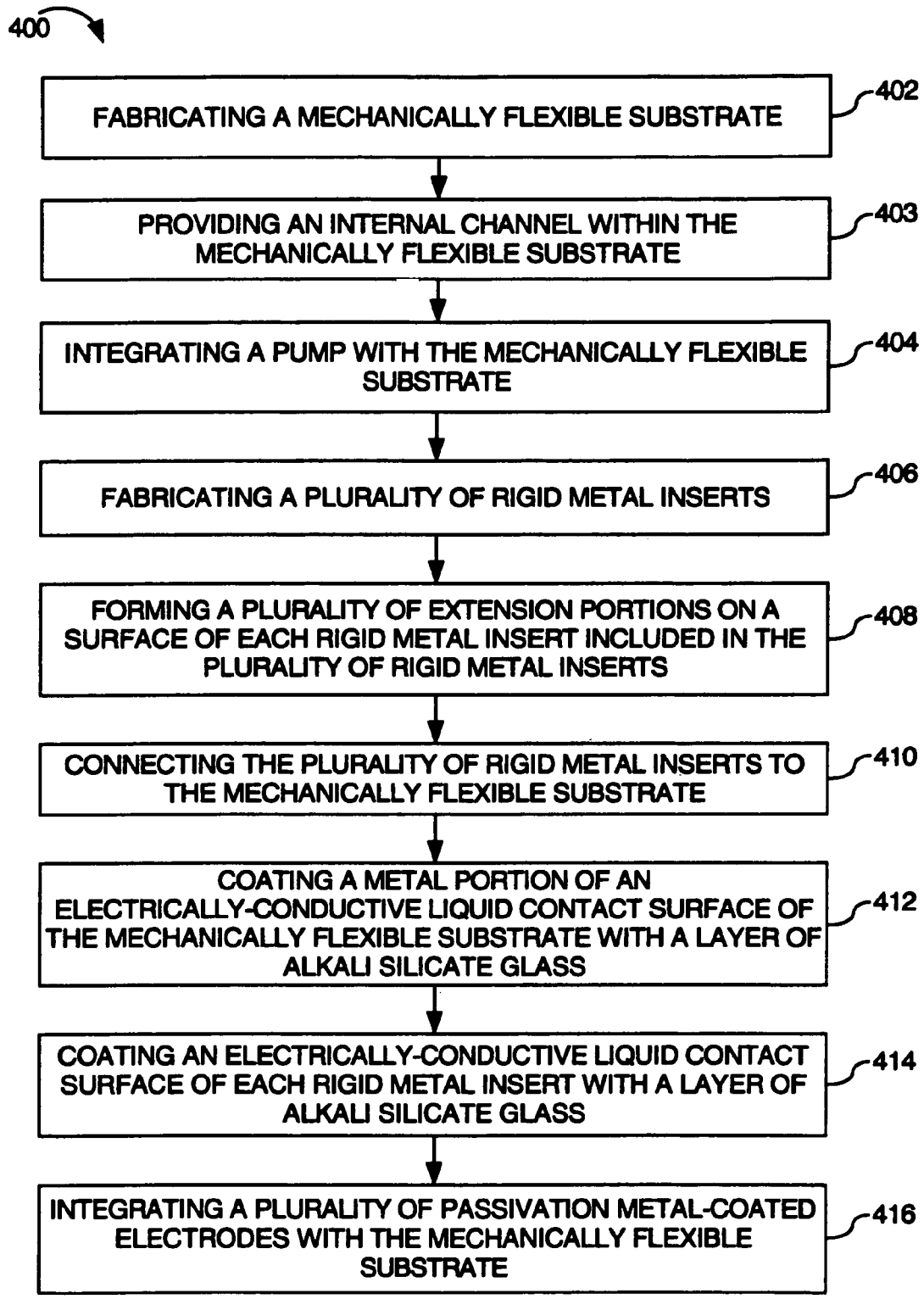
FIG. 4 is a flow chart illustrating a method for fabricating a thermal spreader in accordance with an exemplary embodiment of the present invention.
Figure 5A:
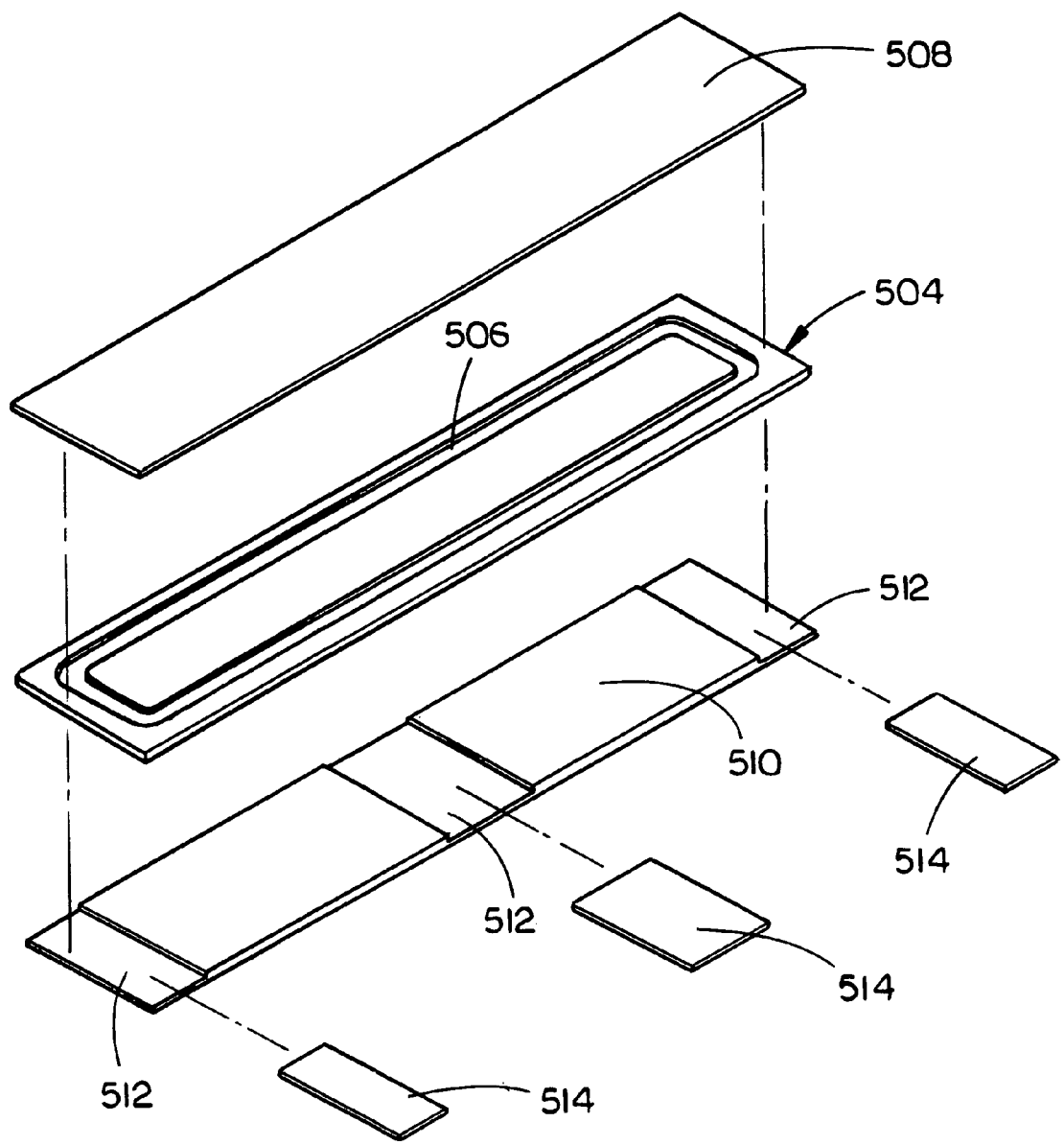
FIG. 5A is an exploded view of a thermal spreader in accordance with an exemplary embodiment of the present invention.

FIG. 4 illustrates a method for fabricating/producing/providing a thermal spreader in accordance with an exemplary embodiment of the present invention. The method 400 may include the step of fabricating a mechanically flexible substrate 402. As mentioned above, at least a portion of the mechanically flexible substrate may be constructed of organic material. The method 400 may further include the step of providing an internal channel within the mechanically flexible substrate 403. The internal channel may be configured for containing an electrically-conductive liquid and may be further configured to allow for closed-loop flow of the electrically-conductive liquid within the internal channel. For example, the internal channel may be provided by forming the internal channel within the mechanically flexible substrate (ex.—the internal channel may be a recess/groove/slotted recess formed within the mechanically flexible substrate, as shown in FIG. 5A) or by integrating the internal channel/flow loop within the mechanically flexible substrate (ex.—the flow loop/internal channel may be a separate component connected to/integrated within/received within/accommodated by the mechanically flexible substrate). The method 400 may further include the step of integrating a pump with the mechanically flexible substrate 404. For example, as described above, the pump may be configured for circulating the electrically-conductive liquid within the internal channel.

The method 400 may further include the step of fabricating a plurality of rigid metal inserts 406. For instance, as discussed above, each rigid metal insert may be configured for being integrated with the mechanically flexible substrate for promoting the transfer of thermal energy both to and from the electrically conductive liquid. As described above, the thermal spreader is configured for being connected to a heat source and a heat sink, and is further configured for directing thermal energy from the heat source to the heat sink via the electrically-conductive liquid. The method 400 may further include the step of forming a plurality of extension portions on a surface of each rigid metal insert included in the plurality of rigid metal inserts 408. For instance, as described above, said extension portions may be configured for promoting thermal energy transfer between the rigid metal insert and the electrically-conductive liquid. The method 400 may further include the step of connecting the plurality of rigid metal inserts to the mechanically flexible substrate 410.

The method 400 may further include the step of coating a metal portion of an electrically-conductive liquid contact surface of the mechanically flexible substrate with a layer of alkali silicate glass 412. The method 400 may further include the step of coating an electrically-conductive liquid contact surface of each rigid metal insert with a layer of alkali silicate glass 414. The method 400 may further include the step of integrating a plurality of passivation metal-coated electrodes with the mechanically flexible substrate 416. As discussed above, said electrodes may be configured for generating an electrical current flow through the electrically-conductive liquid via an applied voltage to said electrodes.

As discussed above, thermal spreaders may be used for diffusing thermal energy from heat sources and for transporting the thermal energy to a location at which the thermal energy (ex.—heat) may be dissipated. For instance, the thermal spreader may be used in electronics to remove heat from a high power electronic component which may be connected to a circuit board, and to conduct said heat/thermal energy to the walls of a chassis in which the circuit board/circuit card is mounted/enclosed. A number of thermal spreaders may be custom-designed/fabricated for use with a particular circuit card assembly and/or may utilize thermal gap filler for providing a thermal path between a power-dissipating component on a circuit card assembly and the thermal spreader. Further, as previously discussed, a number of thermal spreaders may be made of metals and may be expensive to produce due to: a.) high energy costs associated with processing the metals; b.) the processing time required for machined parts; and/or c.) the tooling costs for providing cast or extruded thermal spreaders.

In contrast to metal thermal spreaders, (which utilize conduction) or thermal spreaders implementing heat pipes (which utilize a vapor pressure/capillary force-driven fluid flow), the thermal spreader 100 of the present invention utilizes a pumped, electrically-conductive liquid for transporting thermal energy. The thermal spreader 100 of the present invention implements an approach which may serve to separate the thermal transport mechanism from the structure/structural mechanism, thereby providing good thermal conduction even though the mechanically flexible thermal spreader 100 may be constructed of organic (ex.—mechanically flexible) materials.

Figure 5B:
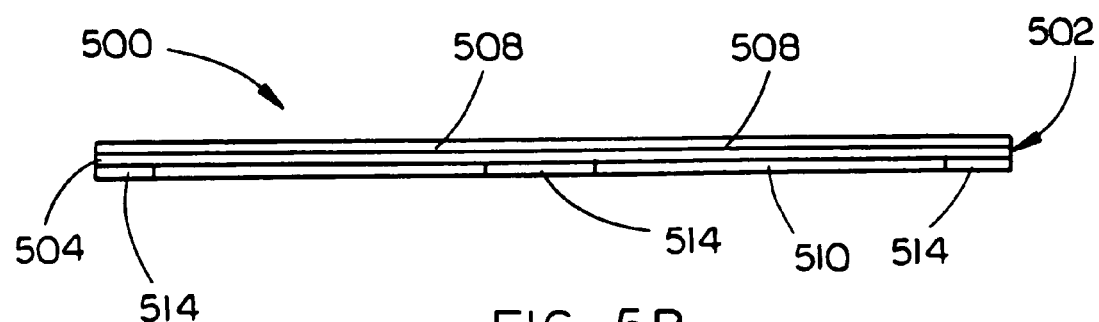
FIG. 5B is a side elevation view of the thermal spreader shown in FIG. 5A when assembled.

Referring generally to FIGS. 5A and 5B, a thermal spreader 500 in accordance with a further exemplary embodiment of the present invention is shown. The thermal spreader 500 may include a mechanically flexible substrate 502. The mechanically flexible substrate 502 may be formed of/may include multiple layer portions. For example, the substrate 502 may be constructed as a 3-layer portion configuration in which a middle/second layer portion 504, which forms/includes an internal channel 506 for containing electrically-conductive liquid, is "sandwiched" between a top/first layer portion 508 and a bottom/third layer portion 510. In additional embodiments, the bottom layer portion 510 may form a plurality of recesses 512 (ex.—slots) configured for allowing the bottom layer portion 510 to integrate with (ex.—receive) a plurality of metallic, high thermal conductivity inserts 514. Said inserts 514 may be configured for providing localized higher heat flux at heat source and/or heat sink locations. In still further embodiments, one or more of the layers (504, 508, 510) may be constructed of organic materials, inorganic materials, or the like for providing the mechanically flexible substrate 502, which may be a low-profile/thin substrate. For instance, said materials may include standard circuit board materials, rigid-flex materials, and/or the like.

Figure 6:
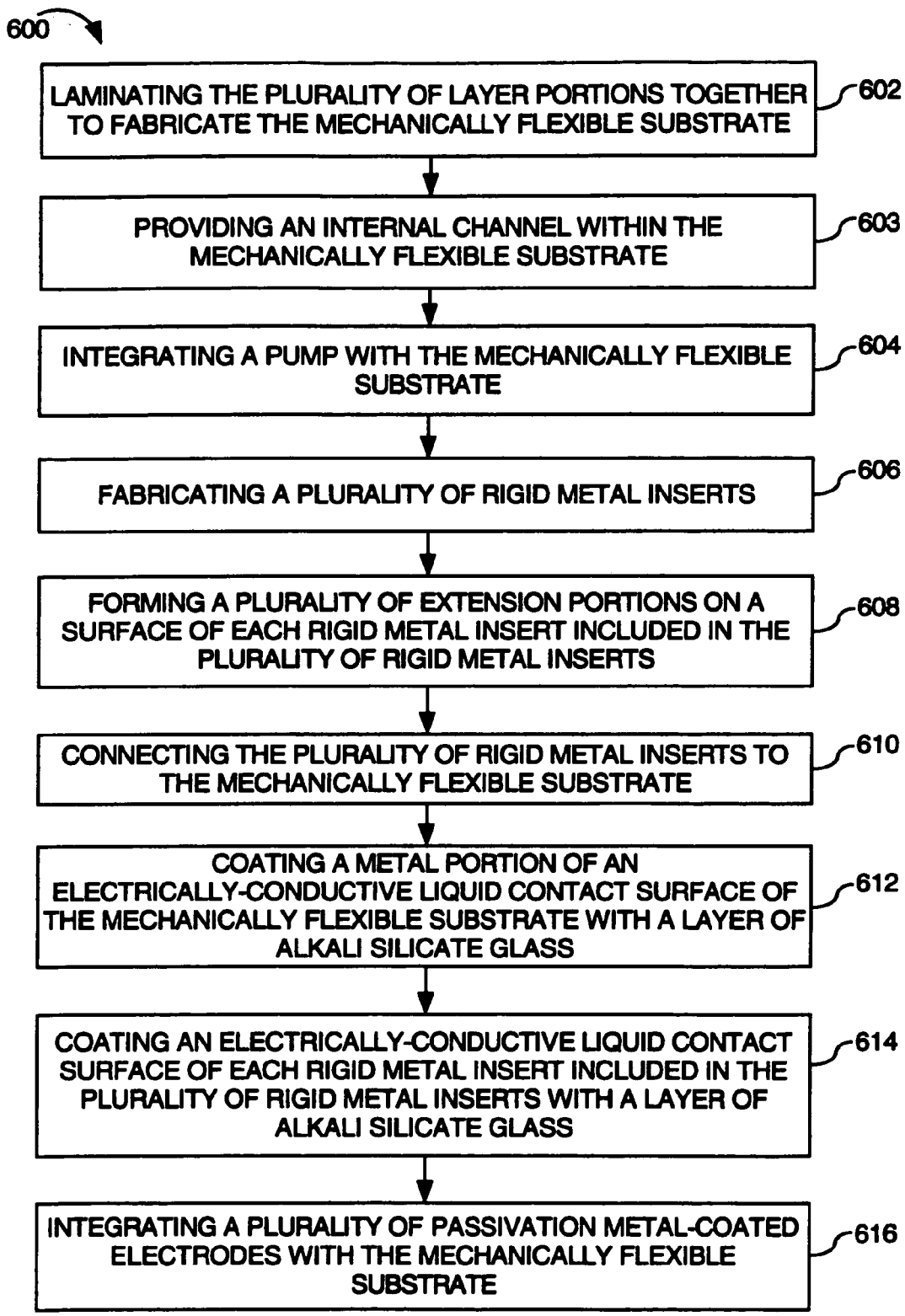
FIG. 6 is a flow chart illustrating a method for fabricating a thermal spreader in accordance with an exemplary embodiment of the present invention.

Referring to FIG. 6, a method for providing/fabricating/producing said thermal spreader 500 is shown. In an exemplary embodiment, the method 600 may include the step of laminating the plurality of layer portions together to fabricate the mechanically flexible substrate 602. As mentioned above, the mechanically flexible substrate may be at least partially constructed of thin, organic material. The method 600 may further include the step of providing an internal channel within the mechanically flexible substrate 603. The internal channel may be configured for containing an electrically-conductive liquid and may be further configured to allow for closed-loop flow of the electrically-conductive liquid within the internal channel. The method 600 may further include the step of integrating a pump with the mechanically flexible substrate 604. For example, as described above, the pump may be configured for circulating the electrically-conductive liquid within the internal channel.

The method 600 may further include the step of fabricating a plurality of rigid metal inserts 606. For instance, as discussed above, each rigid metal insert may be configured for being integrated with the mechanically flexible substrate for promoting the transfer of thermal energy both to and from the electrically conductive liquid. As described above, the thermal spreader is configured for being connected to a heat source and a heat sink, and is further configured for directing thermal energy from the heat source to the heat sink via the electrically-conductive liquid. The method 600 may further include the step of forming a plurality of extension portions on a surface of each rigid metal insert included in the plurality of rigid metal inserts 608. For instance, as described above, said extension portions may be configured for promoting thermal energy transfer between the rigid metal insert and the electrically-conductive liquid.

The method 600 may further include the step of connecting the plurality of rigid metal inserts to the mechanically flexible substrate 610. For example, as discussed above, the inserts may be received by/connected to the substrate via recesses formed by the substrate. The method 600 may further include the step of coating a metal portion of an electrically-conductive liquid contact surface of the mechanically flexible substrate with a layer of alkali silicate glass 612. The method 600 may further include the step of coating an electrically-conductive liquid contact surface of each rigid metal insert included in the plurality of rigid metal inserts with a layer of alkali silicate glass 614. The method 600 may further include the step of integrating a plurality of passivation metal-coated electrodes with the mechanically flexible substrate 616. As discussed above, said electrodes may be configured for generating an electrical current flow through the electrically-conductive liquid via an applied voltage to said electrodes.

Figure 7:
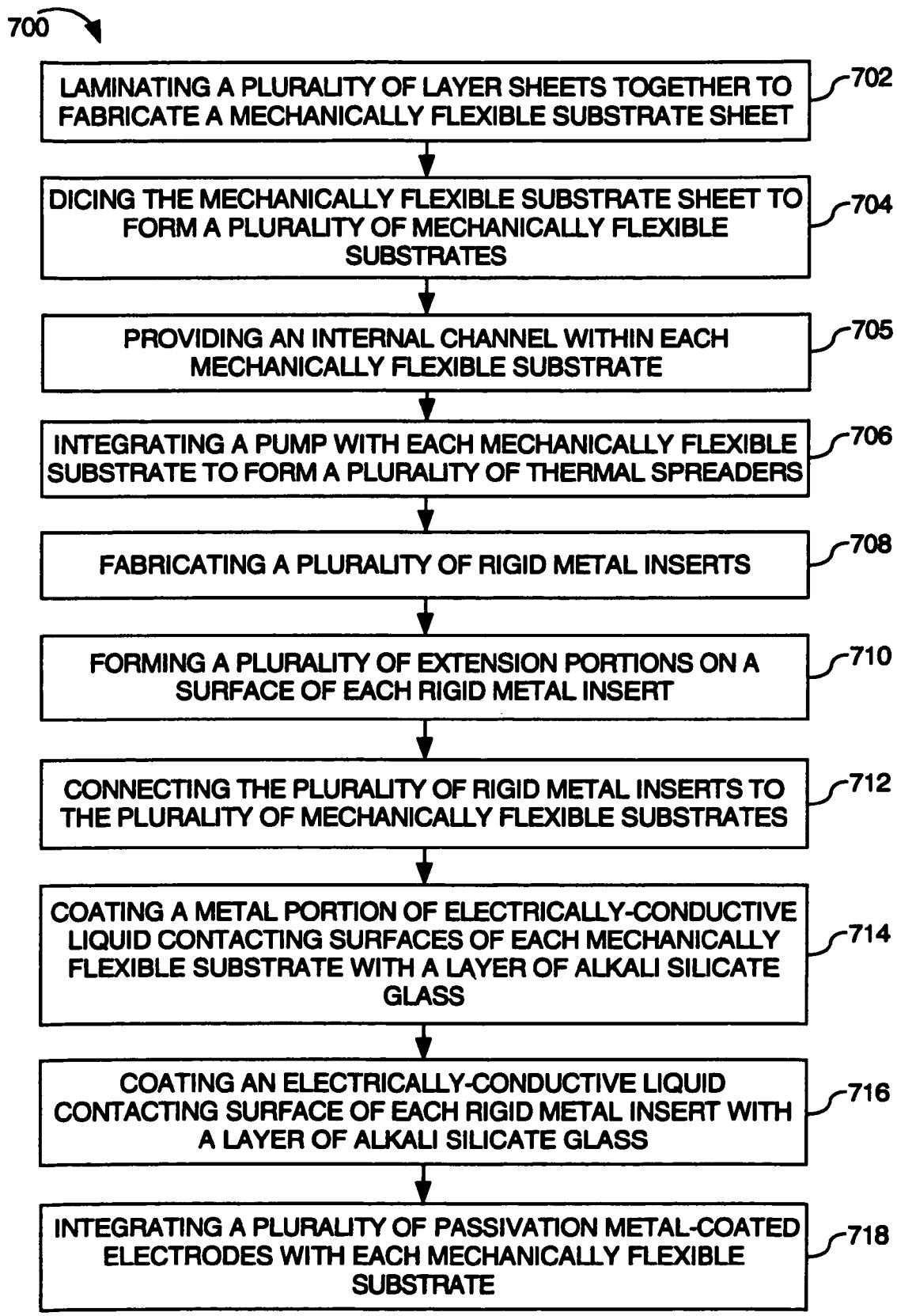
FIG. 7 is a flow chart illustrating a method for fabricating a plurality of thermal spreaders in accordance with an exemplary embodiment of the present invention.
Figure 8:
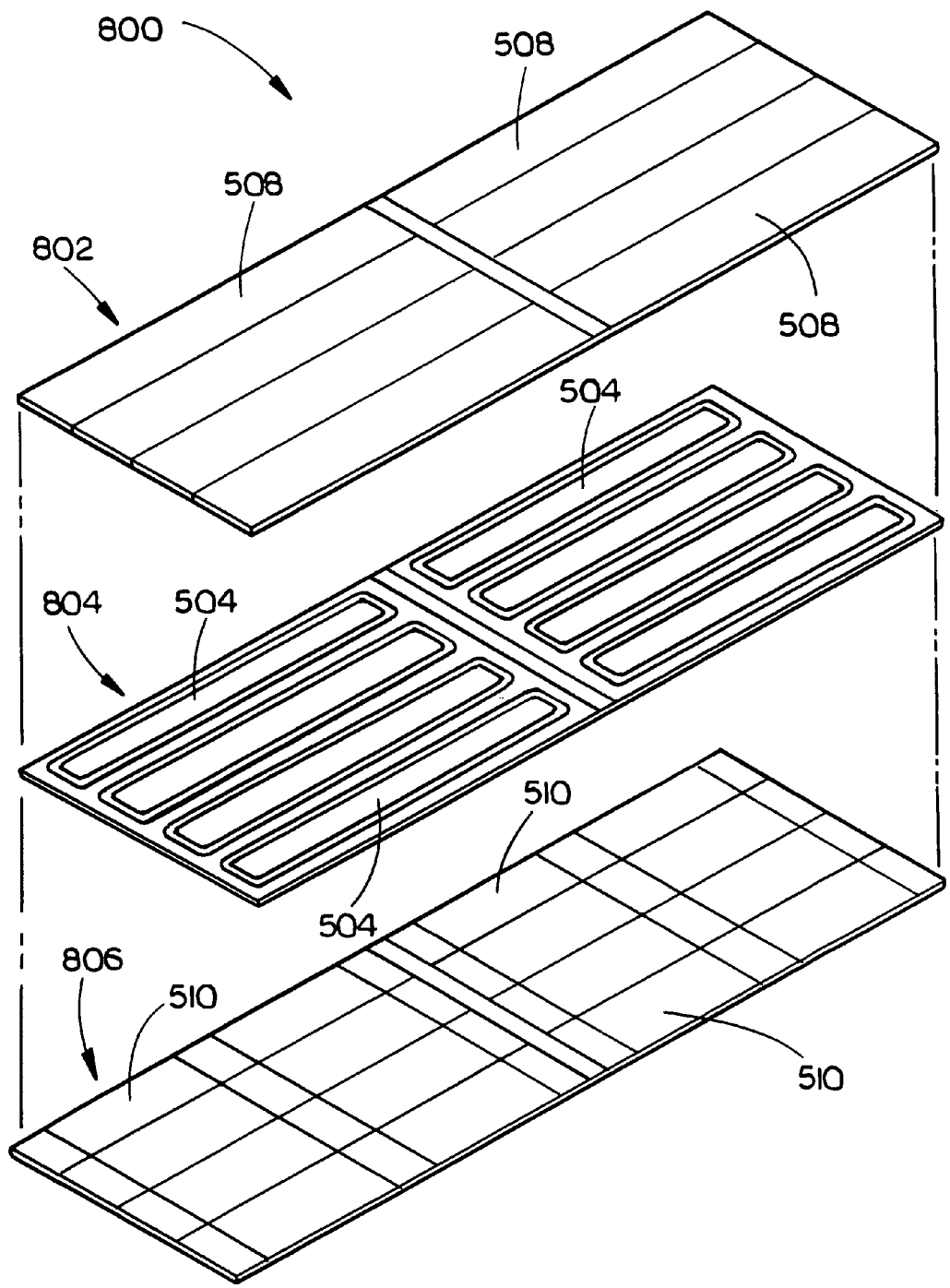
FIG. 8 is a view illustrating a plurality of layer sheets which may be laminated together to fabricate a mechanically flexible substrate sheet, said substrate sheet being implemented in the fabrication method shown in FIG. 7 in accordance with an exemplary embodiment of the present invention.

Referring to FIG. 7, a method 700 for providing/fabricating/producing a plurality of thermal spreaders 500 via additive manufacturing/built-up processing/sequential addition processing/parallel processing/batch processing is shown. In an exemplary embodiment, the method 700 may include the step of laminating a plurality of layer sheets together to fabricate a mechanically flexible substrate sheet 702. For example, as shown in FIG. 8, a first layer sheet 802, which may include a plurality of top/first layer portions 508, a second layer sheet 804, which may include a plurality of middle/second layer portions 504, and a third layer sheet 806, which may include a plurality of bottom/third layer portions 510 may be laminated together to fabricate a mechanically flexible substrate sheet 800. For instance, fabrication of the mechanically flexible substrate sheet may be performed using conventional circuit board manufacturing processes. In further embodiments, the method 700 may further include the step of dicing the mechanically flexible substrate sheet to form a plurality of mechanically flexible substrates 704. As mentioned above, each mechanically flexible substrate may be at least partially constructed of a range of thin, organic materials. The mechanically flexible substrate may also be partially constructed of inorganic materials. The method 700 may further include providing an internal channel within each mechanically flexible substrate included in the plurality of mechanically flexible substrates 705. For example, each internal channel may be configured for containing an electrically-conductive liquid and may be further configured to allow for closed-loop flow of the electrically-conductive liquid within the internal channel.

In additional embodiments, the method 700 may further include the step of integrating a pump with each mechanically flexible substrate included in the plurality of mechanically flexible substrates to form a plurality of thermal spreaders 706. For example, each individual mechanically flexible substrate may be integrated with its own corresponding pump to form a thermal spreader. Still further, the method 700 may further include the step of fabricating a plurality of rigid metal inserts 708. The method 700 may further include the step of forming a plurality of extension portions on a surface of each rigid metal insert included in the plurality of rigid metal inserts 710. The method 700 may further include the step of connecting the plurality of rigid metal inserts to the plurality of mechanically flexible substrates 712.

In exemplary embodiments, the method 700 may further include the step of coating a metal portion of electrically-conductive liquid contacting surfaces of each mechanically flexible substrate included in the plurality of mechanically flexible substrates with a layer of alkali silicate glass 714. The method 700 may further include the step of coating an electrically-conductive liquid contacting surface of each rigid metal insert included in the plurality of rigid metal inserts with a layer of alkali silicate glass 716. The method 700 may further include the step of integrating a plurality of passivation metal-coated electrodes with each mechanically flexible substrate included in the plurality of mechanically flexible substrates 718. In this way, manufacture of the plurality of thermal spreaders may be performed via a low cost, batch processing methodology, utilizing low cost materials. Further said thermal spreaders produced via such methods may be lightweight and suitable for use in weight and size conscious applications, such as airborne electronics and portable consumer electronics (such as laptop computers).

Localized forced convection cooling may be applied for thermal management of electronics. For example, a computer may implement one or more fans for cooling purposes. However the moving parts of the fans may be potential weak links with regards to overall system reliability. Solid-state pumps may be used in liquid cooled systems which demand very high reliability. For instance, one method of solid-state pumping may involve application of a magnetic field in combination with an electric current for applying a pumping force to the liquid/fluid of the liquid cooled system. This magnetic pumping method may require that said liquid have a high electrical conductivity, so liquid metal or any other liquid with sufficiently high electrical conductivity may be implemented. The present invention provides a solid-state mechanism for pumping electrically conductive liquids within a thin, mechanically flexible thermal spreader.

As described above, a magnetic pump, such as a solid-state magnetic pump may be implemented for circulating electrically-conductive liquid within the mechanically flexible substrate of the thermal spreader of the present invention. Referring generally to FIGS. 9, 10A and 10B, an exemplary embodiment of a thermal spreader 900 of the present invention is shown which includes/implements a magnetic pump 110. As previously discussed, the thermal spreader 900 may be a thin, flexible thermal spreader which includes/forms an electrically conductive liquid cooling loop/internal channel 104. Further, the thermal spreader 900 may be configured with embedded electrodes 902. A voltage may be applied across the electrodes 902 for generating a current flow through the electrically conductive liquid.

In current embodiments of the present invention, the thermal spreader 900/pump 110 may be configured with one or more magnets 904. Further, the pump 110 may include a casing, which may, for instance, be constructed of ferrous material (ex.—a ferrous lens 906). Each magnet 904 may be connected to/integrated with/enclosed within/encased by the ferrous lens 906. In exemplary embodiments, when the pump 110 is connected to the mechanically flexible substrate 908 of the thermal spreader 900, the magnets 904 may be positioned/located on opposite sides of the internal channel 104 (as shown in FIG. 10A. The ferrous lens 906 is configured for maximizing the pumping power of the pump 110 and for focusing magnetic flux. The pump 110 further provides a low profile liquid pumping mechanism which may be added/connected to/integrated with the mechanically flexible substrate 908/thermal spreader 900, while still allowing the thermal spreader 900 to remain mechanically flexible. FIG. 10C illustrates that the thermal spreader 900/mechanically flexible substrate 908 may include/may form a slotted portion 910 for allowing the pump 110 to be connected to/received by the thermal spreader 900 and for allowing the ferrous lens 906 to pass through/be received so that said ferrous lens may fully contain a magnetic field generated within the thermal spreader 900.

Figure 11B:
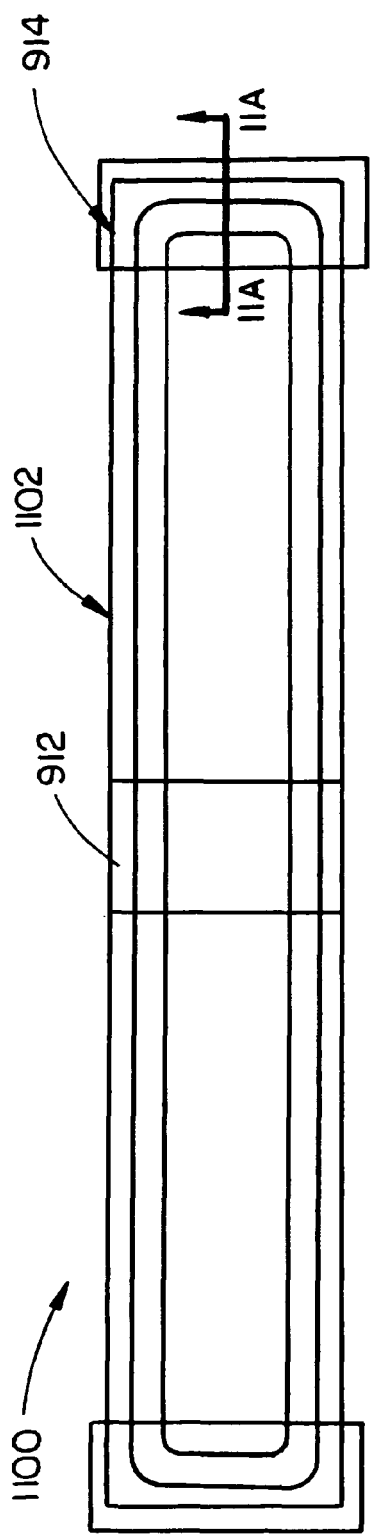
FIG. 11B is a bottom plan cross-sectional view of a mechanically flexible thermal spreader which includes/is integrated with the magnetic pump assembly shown in FIG. 11A in accordance with an exemplary embodiment of the present invention.
Figure 11C:
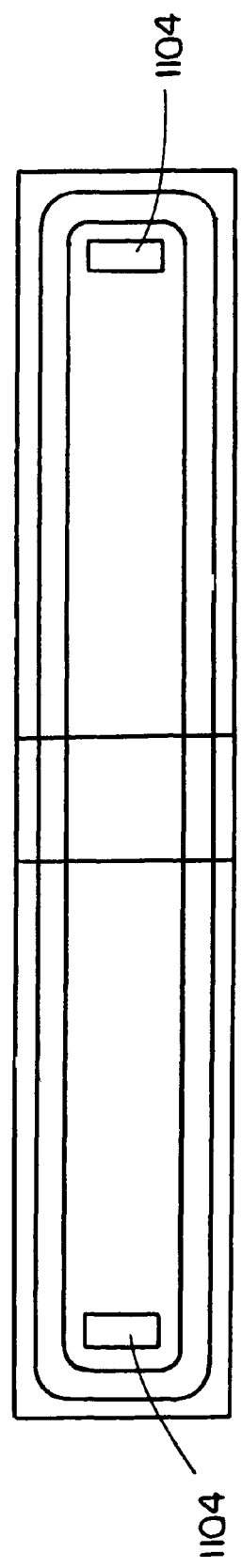
FIG. 11C is a bottom plan cross-sectional view as in FIG. 11 B except that said magnetic pump assembly has been removed to illustrate a slotted portion of the mechanically flexible substrate of the mechanically flexible thermal spreader, said slotted portion configured for receiving the magnetic pump assembly in accordance with an exemplary embodiment of the present invention.
Figure 11A:
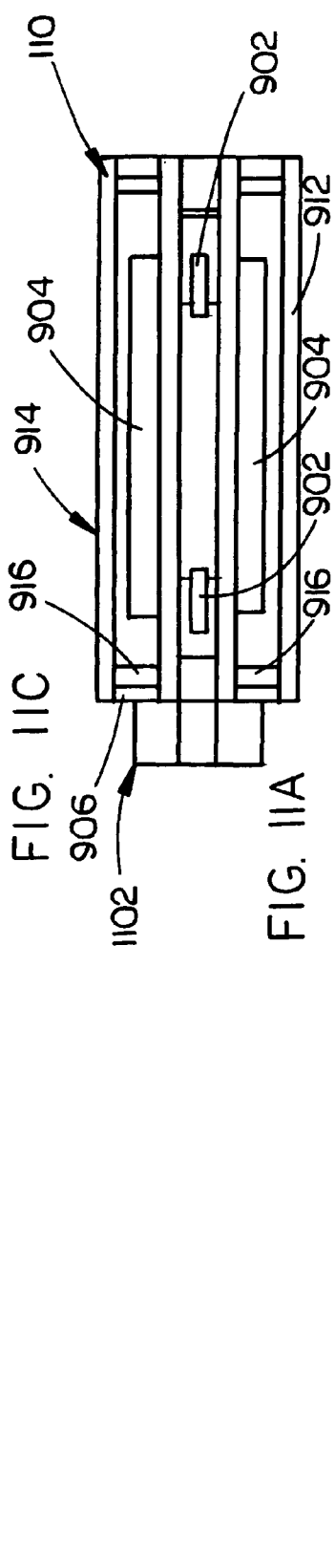
FIG. 11A is a cross-sectional view of a magnetic pump assembly which includes a magnetic pump integrated with a thermally conductive rigid metal insert in accordance with an exemplary embodiment of the present invention.

In further embodiments, the pump 110 may be configured for being integrated with a rigid metal insert 912 to form a magnetic pump assembly/pump-rigid metal insert assembly 914, as shown in FIGS. 11A and 11B. In an exemplary embodiment, a thermal spreader 1100 may be provided which includes the pump-rigid metal insert assembly 914. For instance, the pump-rigid metal insert assembly 914 may be configured for being connected to a mechanically flexible substrate 1102 of the thermal spreader. The substrate 1102 may include/form a slotted portion 1104 (as shown in FIG. 11C) for receiving/connecting with the pump-rigid metal insert assembly 914. The rigid metal insert 912 may be configured for promoting heat transfer between the thermal spreader 1100 and the electrically-conductive liquid (ex.—for promoting thermal energy transfer/local heat transfer to/into and from/out of the electrically-conductive liquid/coolant). Further, the pump 110 may be constructed of a thermally conductive material (ex.—metal) which may, in combination with the metal of the insert 912, allow for the pump-rigid metal insert assembly 914 to provide thermal conduction/thermal spreading properties to the thermal spreader 1100 of the present invention. The ferrous lens 906 may form/may include one or more vias 916 which may be at least partially filled with a thermally-conductive material for promoting increased local thermal conductivity of the pump-rigid metal insert assembly 914.

When implementing a magnetic pump with an electrically-conductive cooling loop, a current path (generated via the electrodes) through the moving liquid in a uniform or non-uniform magnetic field may be an arc, rather than following a straight line. If the arc bridges outside of the magnetic field, the efficiency of the pump may be significantly reduced, which may result in lower fluid flow rates and/or pressure head. As the magnetic pump is miniaturized, the effects of the non-uniform magnetic field may become more significant.

For the pump 110 implemented in the present invention, the force induced on the electrically-conductive liquid may be due to current flowing through the liquid between the electrodes 902. The effective electrical impedance of the electrically-conductive liquid may be a function of the applied magnetic field. In an ideal system, a constrained, straight-line current path in a uniform magnetic field resulting in a uniform force on the liquid metal across the internal channel 104 would occur, as shown in FIG. 12. However, in practice, the magnetic field (and therefore the impedance) may generally not be uniform and the current path may generally not be a straight line due to the continuous force on the electrons normal to the direction of the current. Variation in magnetic flux across the internal channel 104/pump channel may also contribute to the deviation in current path and subsequent pump head pressure non-uniformity. In a system, considering/assuming a uniform magnetic field is applied, the current path may generally flow in an arc rather than a straight line. Under worst case conditions, current flow may occur at regions beyond the magnetic field and may thus produce reduced pumping force on the liquid/fluid, as shown in FIG. 13. The effect of such arcing/curvature of the electric current may become more significant (particularly in the direction of the liquid flow) as the pump is miniaturized. If the pump 110 is integrated into a flexible thermal spreader, as described above, the need to maintain a short/small profile pump may be significant for maintaining the overall flexibility of the thermal spreader.

Referring to FIG. 14, a magnetic pump 1400 for circulating electrically-conductive liquid within an internal flow channel/electrically conductive cooling loop 104, in accordance with a further exemplary embodiment of the present invention, is shown. In the illustrated embodiment, the magnetic pump 1400 (ex.—a casing of the magnetic pump, such as the ferrous casing described above) may include/form an input port 1402 and an output port 1404. As described above, the magnetic pump 1400 may be connected to a mechanically flexible substrate 102 of a thermal spreader 100. Further, the mechanically flexible substrate may form an internal channel 104 within which electrically-conductive liquid may circulate/flow for promoting cooling properties of the thermal spreader 100. The magnetic pump 1400, may be configured for applying a magnetic field to electrically-conductive liquid within the internal channel 104 for providing pumping force to the liquid. Said magnetic force is applied via magnets 904 enclosed within the ferrous lens 906 of the pump 1400.

In the illustrated embodiment, the magnetic pump 1400/magnetic pump casing may include/may form a plurality of magnet flow channels 1406. The magnet flow channels 1406 may be configured/formed proximal to the output port 1404 of the pump. The magnetic pump 1400/magnetic pump casing may be further configured with channel walls 1408 for separating the magnet flow channels 1406. The magnet flow channels/dielectric flow straightener channels 1406 may be configured for allowing the electrically-conductive liquid within the internal channel to flow through the pump 1400 (ex.—the liquid may flow from/into the input port 1402 and past/through the output port 1404 of the pump 1400) in the direction of flow of the liquid. However, the channel walls 1408 may be configured for being non-electrically conductive, and thus, may further be configured for preventing current flow in a direction generally perpendicular to the direction of the flow of the liquid, thereby promoting increased or maximized pumping power/pumping efficiency for the pump 1400. Further, the pump 1400 described in the embodiment above, by inhibiting current flow in regions of lower magnetic flux, may be easily miniaturized for allowing said pump 1400 to be implemented in a thermal spreader 100 as described above in such a manner that allows the flexibility of said mechanically flexible thermal spreader 100 to be maintained.

Power/heat/thermal energy dissipated by electronics and other systems, such as internal combustion engines, may be transported from the heat source to a location where said heat may be transferred to the environment. Said transport of heat may occur via a thermal path, such as by conduction (ex.—via solid materials), or by convection, to fluids/liquids which travel between heat dissipating and heat absorbing surfaces. Issues such as mechanical tolerance stack-up, maintenance requirements, the need for vibration isolation, etc., may make it generally difficult to utilize a completely rigid system for said thermal path. However, a number of compliant mechanisms for providing said thermal path may have less than desirable/low thermal transport properties. The present invention describes a flexible thermal path which may allow two bodies (ex.—heat source and heat sink) to remain in good thermal contact without being mechanically affixed to each other.

As discussed above, an electrically conductive liquid cooling loop may be formed/embedded/included within a mechanically flexible substrate. Also discussed above was the idea of integrating metallic inserts with/within the substrate at regions of high heat flux into or out of the substrate for minimizing overall thermal resistance.

Figure 15A:
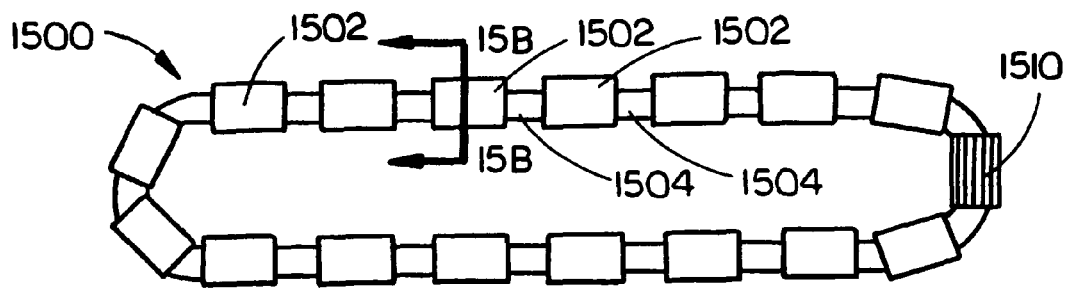
FIG. 15A is a side elevation view of a flexible liquid cooling loop for providing a thermal path between a heat source surface and heat sink surface in accordance with an exemplary embodiment of the present invention.
Figure 15B:
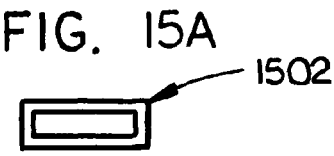
FIG. 15B is a cross-sectional view of a mechanically rigid tubing section of the flexible liquid cooling loop shown in FIG. 15A in accordance with an exemplary embodiment of the present invention.

Referring generally to FIGS. 15A, 15B, 15C and 15D, a flexible liquid cooling loop for providing a thermal path between a heat source surface and heat sink surface in accordance with an exemplary embodiment of the present invention is shown. In the illustrated embodiment, the flexible cooling loop 1500 includes a plurality of mechanically rigid tubing sections 1502 (ex.—short, generally rectangular cross-section tubing sections, as shown in FIG. 15B). The flexible cooling loop 1500 further includes a plurality of mechanically flexible tubing sections 1504. The mechanically rigid tubing sections 1502 may be connected by/held together by the mechanically flexible tubing sections 1504 (ex.—mechanically compliant couplings) to form the loop 1500. The loop 1500 may be configured for containing a liquid (ex.—an electrically-conductive liquid) which may be circulated within the loop 1500 for promoting the transfer of thermal energy (ex.—heat) from a heat source surface 1506 (ex.—a heat dissipating surface/hot surface) to a heat sink surface 1508 (ex.—a heat absorbing surface/cool surface) via the loop 1500.

Figure 15C:
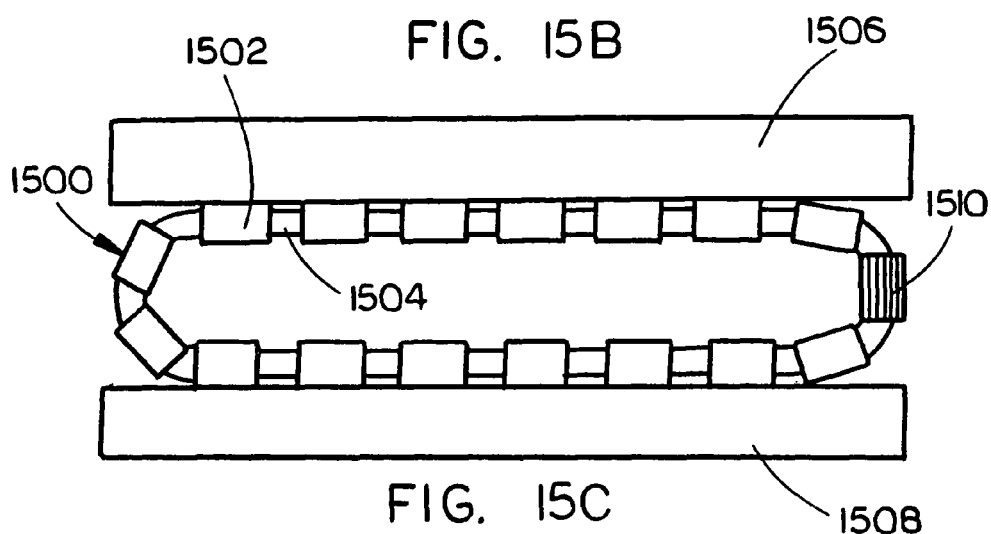
FIG. 15C is a side elevation view of the flexible liquid cooling loop shown in FIG. 15A being in thermal contact with a heat source and a heat sink in accordance with an exemplary embodiment of the present invention.

In further embodiments, as shown in FIG. 15C, one or more of the mechanically rigid tubing sections 1502 may be configured for contacting/being directed against/the heat source surface 1506 during implementation of the loop 1500. Also, one or more of the mechanically flexible tubing sections 1504 may be configured for contacting/being directed against/the heat sink surface 1508 during implementation of the loop 1500, thereby allowing the loop 1500 to provide a thermal path for directing heat from the heat source 1506 to the heat sink 1508. For instance, the loop 1500 may be positioned/sandwiched between the heat source 1506 and the heat sink 1508. In exemplary embodiments, the rigid tubing sections 1502 of the loop 1500 may be constructed of a material which promotes improved heat transfer (ex.—metal) and/or may be constructed of a material which may provide a light/reduced weight loop (ex.—organic materials). In further embodiments, the flexible tubing sections 1504 may be constructed of flexible, rubber-like/elastomeric material(s).

In additional embodiments, the loop 1500 may include one or more pumps 1510 (ex.—a solid-state magnetic pump). The pump 1510 may be configured for being connected to/integrated within/integrated into the loop via the mechanically flexible couplings 1504. The pump 1504 may be further configured for circulating the liquid within the loop 1500 for promoting transfer of heat from the heat source 1506 to the heat sink 1508 via the loop 1500. In embodiments in which the pump 1510 is included in/as part of the loop 1500, the liquid in the loop may not be required to be electrically conductive. In the present invention, the pump(s)/individual pump sections 1510 may be easily fabricated and tested prior to being assembled into the rest of the loop 1500.

The loop 1500 of the present invention may be conformable to non-smooth heat sink/heat source surfaces. Consequently, the loop 1500 of the present invention may be less sensitive to roughness or debris of heat sink/heat source surfaces, than would be the case if, for instance, the loop-heat source surface interface were a solid-solid interface over the entire heat transfer area (ex.—an interface in which said loop was not conformable to the heat source surface).

Figure 15D:
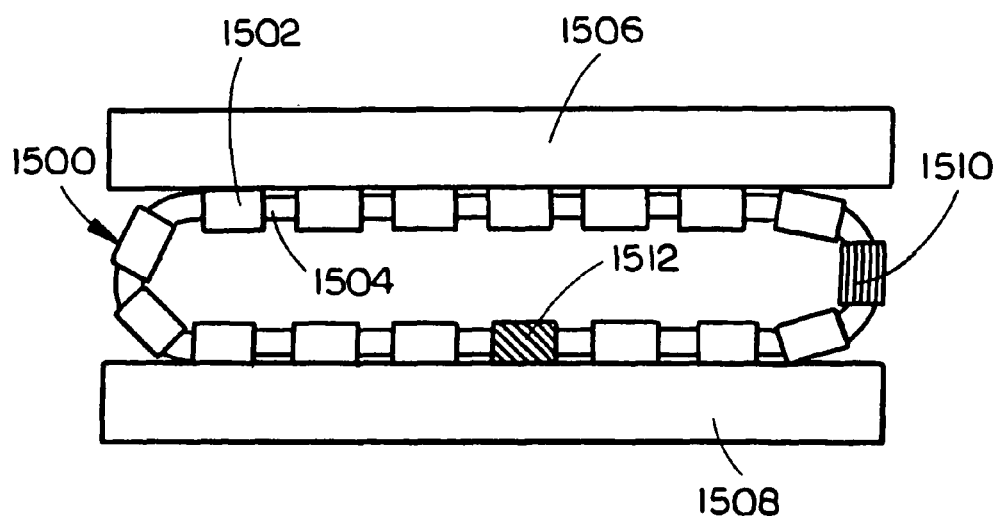
FIG. 15D is a side elevation view of a flexible liquid cooling loop which includes a thermoelectric generator, said flexible liquid cooling loop shown as being in thermal contact with a heat source and a heat sink in accordance with an exemplary embodiment of the present invention.

In exemplary embodiments, the loop 1500 may further include one or more thermoelectric generators/thermoelectric modules 1512 (as shown in FIG. 15D). The module(s) 1512 may be integrated into the loop 1500/connected via the flexible tubing sections 1504 at one or more locations/points at which heat is transferred into/out of the liquid cooling loop 1500. The modules 1512 may be configured for "tapping" into part of the flow of heat into/out of the loop for generating electrical power and providing said electrical power to the pump(s) 1510 for driving the pump(s) 1510 to produce a net-passive device. The loop 1500 of the present invention provides an inherently parallel thermal path configuration which promotes the prevention of impeded thermal transfer to/from the loop 1500, for instance, when said generator/module 1512 is implemented in the loop 1500.

The flexible liquid cooling loop 1500 may be implemented in/integrated within/embedded within thermal spreader. Further, the flexible liquid cooling loop 1500 may be implemented in/integrated within/embedded within a mechanically flexible substrate of a mechanically flexible, thin thermal spreader, such as one or more of the thermal spreader embodiments described above.

Figure 16:
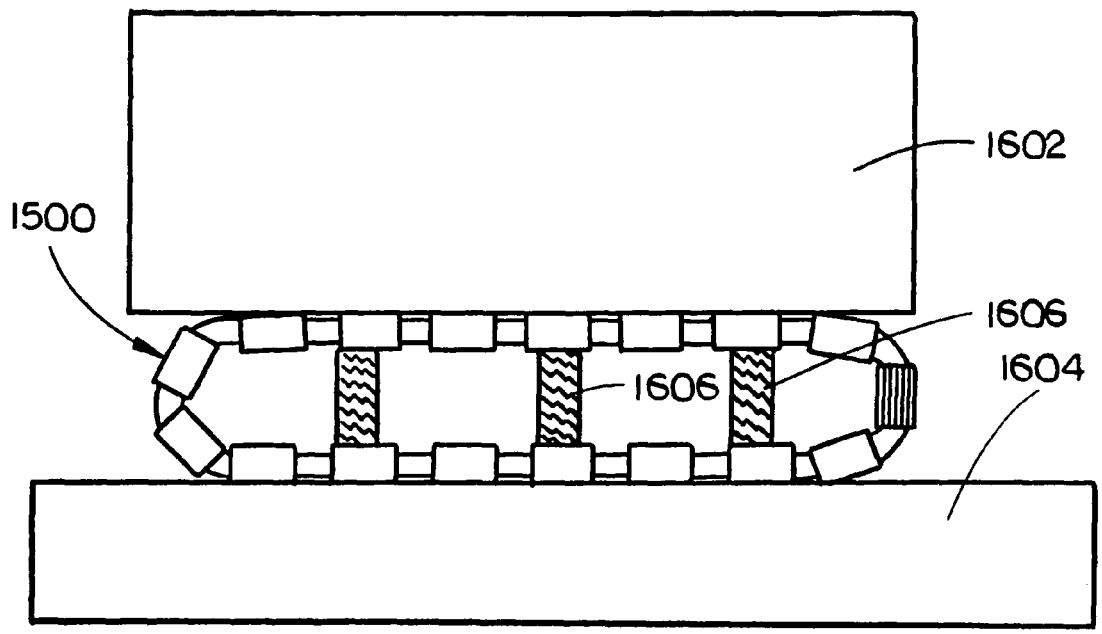
FIG. 16 is a side elevation view of a flexible liquid cooling loop being implemented as a thermal bridge between an electronics component of a vehicle and a mounting plate of the vehicle when said electronics component is mounted to said mounting plate via vibration isolators in accordance with an exemplary embodiment of the present invention.

In further exemplary embodiments, as shown in FIG. 16, the flexible cooling loop 1500 may be implemented for providing a thermal path from a heat dissipating system 1602 (ex.—an electronics system) to a mounting plate 1604 (ex.—a vehicle chassis, machinery, etc.). Further, a plurality of vibration isolators 1606 may be included in a connection between/for connecting said heat dissipating system 1602 and the mounting plate 1604. In the scenario shown in FIG. 16, the loop 1500 may provide the thermal path to the mounting plate 1604, while the heat dissipating system 1602 is protected from high vibration and/or dynamic shock induced motion of the mounting plate 1604.

Figure 17A:
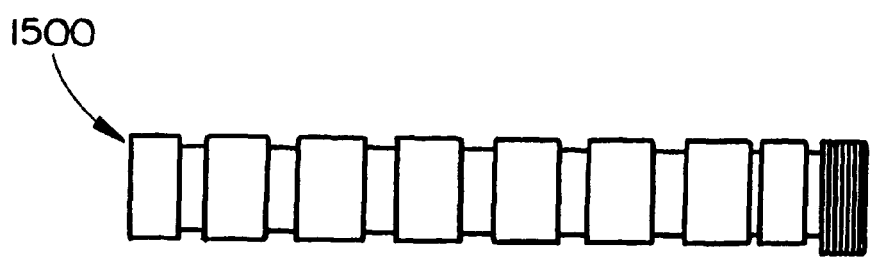
FIG. 17A is a top plan view of a flexible liquid cooling loop having a "watchband" configuration in accordance with an exemplary embodiment of the present invention.
Figure 17B:
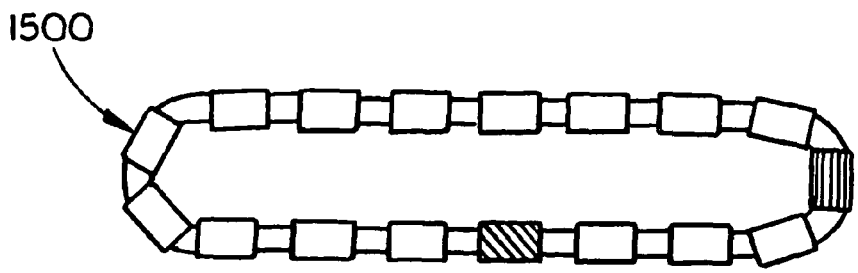
FIG. 17B is a side elevation view of the flexible liquid cooling loop shown in FIG. 17A in accordance with an exemplary embodiment of the present invention.
Figure 18A:
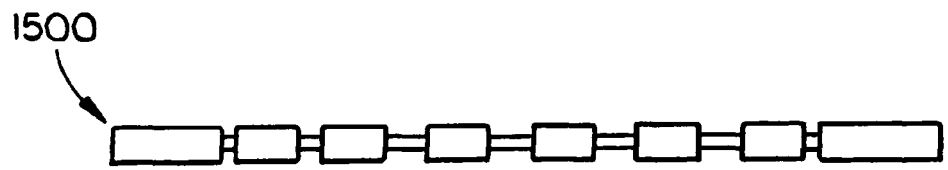
FIG. 18A is a top plan view of a flexible liquid cooling loop having a "racetrack" configuration in accordance with an exemplary embodiment of the present invention.
Figure 18B:
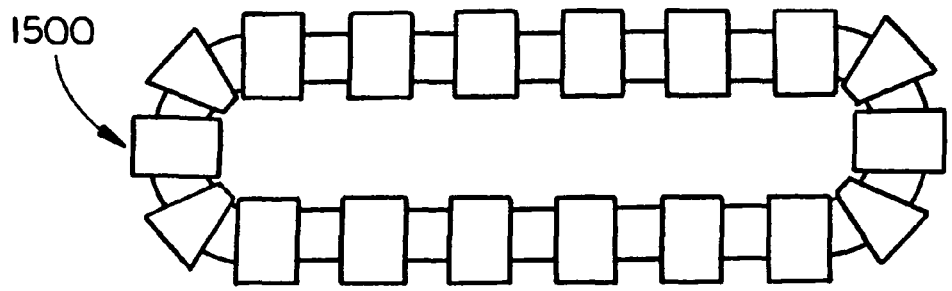
FIG. 18B is a side elevation view of the flexible liquid cooling loop shown in FIG. 18A in accordance with an exemplary embodiment of the present invention.

Referring generally to FIGS. 17A, 17B, 18A and 18B, the flexible liquid cooling loop 1500 of the present invention may have a variety of configurations. For example, as shown in FIGS. 17A and 17B, the loop 1500 (as illustrated in top (FIG. 17A) and side (FIG. 17B) views) may be "watchband"-style configuration, wherein said loop is conformable, for instance, similar to a metal watchband. Further, as shown in FIGS. 18A and 18B, the loop 1500 (as illustrated in top (FIG. 18A) and side (FIG. 18B) views) may be a flat, "racetrack" configuration.

In alternative embodiments, the loop 1500 may be constructed as a single portion of mechanically flexible tubing connected through/connecting the plurality of mechanically rigid sections 1502, allowing for a unitary, mechanically flexible tubing construction rather than implementing the multiple, mechanically flexible tubing couplings 1504.

Figure 19A:
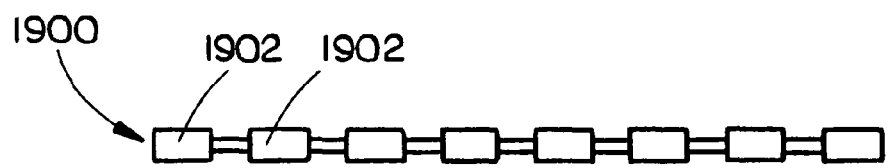
FIG. 19A is a top plan view of a liquid cooling loop in accordance with an alternative exemplary embodiment of the present invention.
Figure 19B:
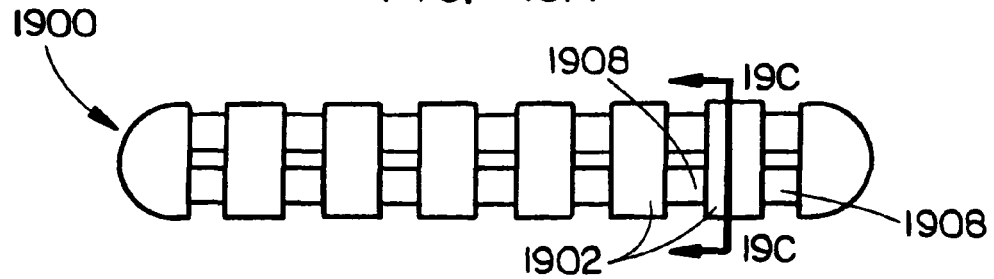
FIG. 19B is a side elevation view of the liquid cooling loop shown in FIG. 19A in accordance with an exemplary embodiment of the present invention.
Figure 19C:
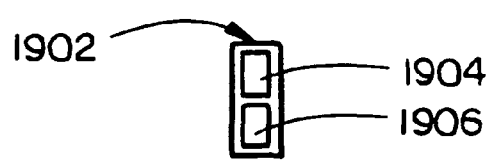
FIG. 19C is a cross-sectional view of a mechanically rigid tubing section of the liquid cooling loop shown in FIGS. 19A and 19B in accordance with an exemplary embodiment of the present invention.

Referring generally to FIGS. 19A (top view) and 19B (side view), a liquid cooling loop 1900 for providing a thermal path between a heat source surface and a heat sink surface in accordance with an alternative exemplary embodiment of the present invention is shown. The loop 1900 may include a plurality of mechanically rigid tubing sections 1902. (ex—generally rectangular hollow cross-sections, as shown in FIG. 19C). Each mechanically rigid section 1902 may form a first compartment 1904 and a second compartment 1906. The loop 1900 may further include a plurality of mechanically flexible tubing sections 1908. The mechanically flexible tubing sections 1908 may connect the rigid sections 1902 to form the loop 1900. For example, a first set of the flexible tubing sections 1910 may connect the rigid sections 1902 by being (ex.—insertably) connected into the first compartments 1904 of the rigid sections 1902. Further, a second set of the flexible tubing sections 1912 may connect the rigid sections 1902 by being (ex.—insertably) connected into the second compartments 1906 of the rigid sections 1902. The compartmentalized construction of the rigid sections 1902 may prevent the first set of flexible sections 1910 and second set of flexible sections 1912 from coming into contact with each other, thereby segregating the liquid of the loop 1900.

A number of assembly methods may be implemented for producing the loop (1500, 1900) embodiments as described above. Individual sections may be fabricated. For example, the rigid sections (ex.—metal sections) 1502 may be constructed by cutting an extruded tube. The loop 1500 may then be assembled by connecting the individual rigid sections 1502 to the flexible sections/couplings 1504, for instance, via an adhesive. Alternatively, the loop 1500, 1900 may be constructed via additive manufacturing, such as via an Objet Connex 500 which may print both rigid and flexible materials in a built-up assembly.

Referring generally to FIG. 20, a mechanically flexible substrate 2000 in accordance with a further alternative embodiment of the present invention is shown. In the illustrated embodiment, the mechanically flexible substrate 2000 may include/may form an internal channel 2002. For instance, the internal channel 2002 may be configured for containing electrically-conductive liquid. The substrate 2000 may be further configured with a wall 2004, said wall 2004 being configured within the internal channel 2002. The substrate 2000 may further include one or more flexible bladders 2006. The bladder 2006 may be connected to the wall 2004, such that said wall 2004 may direct liquid flowing within the channel 2002 towards the bladder 2006 as shown. The bladder 2006 may be connected to the substrate 2000, such that said bladder 2006 may be connected to an interior surface 2008 of the substrate 2000 (ex.—inside of the internal channel 2002, as shown in FIG. 21A, or to an exterior surface 2010 of the substrate 2000 (ex.—outside of the internal channel 2002, as shown in FIG. 21B). Said bladder 2006 may be configured to bulge, as the liquid flowing within the internal channel 2002 exerts force against the bladder, thereby allowing the substrate 2000 to account for changes in pressure due to stack-up height.

Figure 22A:
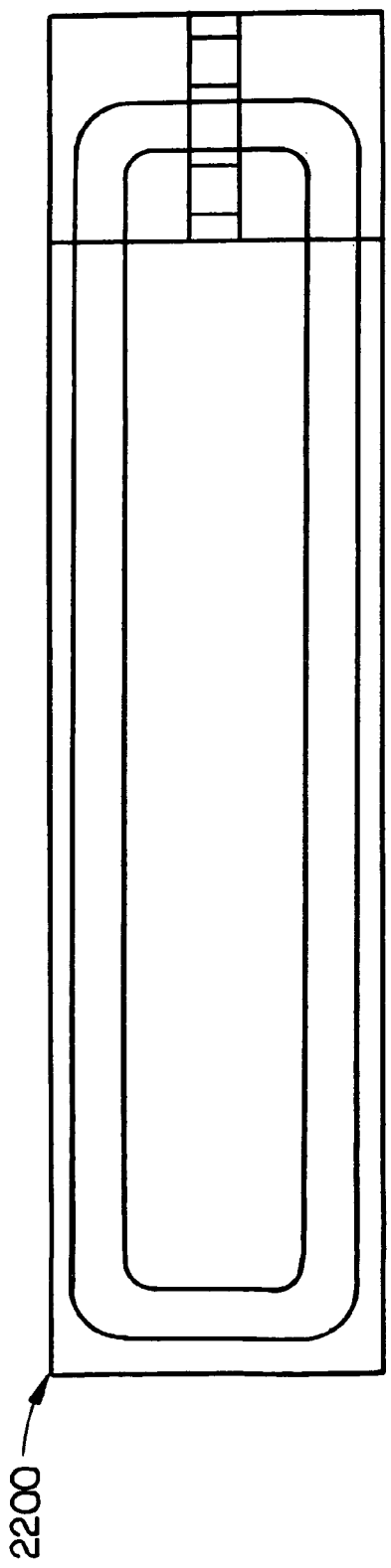
FIG. 22A is a bottom plan cross-sectional view of a mechanically flexible substrate having a microchannel fabricated into the substrate via film-based photoresists in accordance with a further exemplary embodiment of the present invention.
Figure 22B:
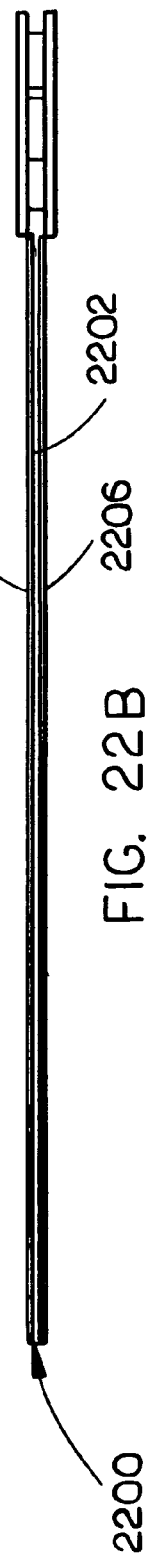
FIG. 22B is a side elevation view of the mechanically flexible substrate shown in FIG. 22A in accordance with an exemplary embodiment of the present invention.
Figure 23:
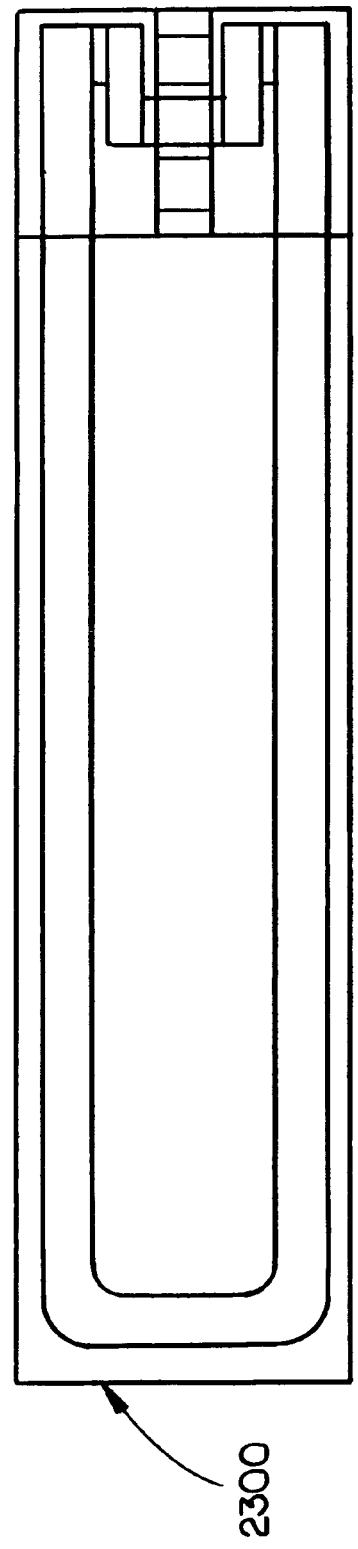
FIG. 23 is a bottom plan cross-sectional view of a mechanically flexible substrate which is configured for minimizing a channel-to-chassis interconnect for the substrate in accordance with an exemplary embodiment of the present invention.

In further exemplary embodiments, as shown in FIGS. 22A and 22B, a mechanically flexible substrate 2200 may be configured with one or more microchannels 2202. For example, microchannels 2202 may be fabricated into or onto the substrate 2200 via permanent photoresists. In a further example, microchannels 2202 (ex.—the channel layer(s)) may be fabricated via permanent film-based photoresists, in which thin film barriers 2204, 2206 may be applied to the flexible substrate 2200 above and below the channel via lamination), thereby providing an inexpensive way to form a simple or complex microchannel 2202. Further, a mechanically flexible substrate 2300 (ex.—the internal channel/microchannel) may be formed/constructed to minimize channel-to-chassis interconnect, as shown in FIG. 23.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A magnetic pump for integration with a mechanically flexible thermal spreader, said magnetic pump comprising:
    a casing, the casing configured for being connected to a mechanically flexible substrate of the thermal spreader, the casing defining a flow channel having an inlet, and outlet, and a plurality of flow straightening channels provided between the inlet and the outlet and configured to separate and straighten the flow of an electrically conductive liquid flowing through the flow channel; and
    a plurality of magnets, the plurality of magnets configured for being integrated with and at least partially enclosed by the casing, the plurality of magnets configured for applying a magnetic field to an electrically-conductive liquid, said magnets further configured for implementation with a plurality of electrodes, said electrodes being integrated within the mechanically flexible substrate for generating an electrical current flow through said liquid via a voltage applied across said electrodes, said magnets, in combination with said electrodes, configured for providing a pumping force for circulating the electrically-conductive liquid within an internal channel of an electrically-conductive cooling loop of the mechanically flexible substrate for promoting thermal conductivity of the thermal spreader;
    wherein said casing is configured to fully contain the applied magnetic field and to focus the magnetic field into the liquid metal when the casing is connected with the mechanically flexible substrate; and
    wherein the plurality of flow straightening channels are provided outside the applied magnetic field and the electrical current flow through the electrically conductive liquid.

2. A magnetic pump as claimed in claim 1, wherein the pump is a solid-state magnetic pump.

3. A magnetic pump as claimed in claim 1, wherein the mechanically flexible thermal spreader is at least partially constructed of organic materials.

4. A magnetic pump as claimed in claim 1, wherein the magnetic pump is configured for being connected to the thermal spreader via a slotted portion of the mechanically flexible substrate.

5. A magnetic pump as claimed in claim 1, wherein the electrically-conductive liquid includes liquid metal.

6. A magnetic pump as claimed in claim 1, wherein said casing is constructed of ferrous material.

7. A magnetic pump assembly for integration with a mechanically flexible thermal spreader, said magnetic pump assembly comprising:
    a casing, the casing configured for being connected to a mechanically flexible substrate of the thermal spreader, the casing comprising a flow channel, the flow channel having a plurality of flow straightener channels extending across the flow channel and configured to direct the conductive liquid through the pump;
    a plurality of magnets, the plurality of magnets configured for being integrated with and at least partially enclosed by the casing, the plurality of magnets configured for applying a magnetic field to an electrically-conductive liquid, said magnets further configured for implementation with a plurality of electrodes, said electrodes being integrated within the mechanically flexible substrate for generating an electrical current flow through said liquid via a voltage applied across said electrodes, said magnets, in combination with said electrodes, configured for providing a pumping force for circulating the electrically-conductive liquid within an internal channel of an electrically-conductive cooling loop of the mechanically flexible substrate; and
    a rigid metal insert, the rigid metal insert configured for being integrated with the casing,
    wherein said assembly is configured for promoting local thermal conductivity of the thermal spreader; and
    wherein the plurality of flow straightener channels are provided substantially outside the applied magnetic field and the electric current flow through the electrically conductive liquid.

8. A magnetic pump assembly as claimed in claim 7, wherein the casing forms a plurality of vias, said vias at least partially filled with a thermally-conductive material for further promoting local thermal conductivity of the thermal spreader.

9. A magnetic pump assembly as claimed in claim 7, wherein the pump is a solid-state magnetic pump.

10. A magnetic pump assembly as claimed in claim 7, wherein the mechanically flexible thermal spreader is at least partially constructed of organic materials.

11. A magnetic pump assembly as claimed in claim 7, wherein the electrically-conductive liquid includes liquid metal.

12. A magnetic pump assembly as claimed in claim 7, wherein said casing is configured for fully containing the applied magnetic field when connected with said mechanically flexible substrate.

13. A magnetic pump assembly as claimed in claim 7, wherein the magnetic pump assembly is configured for being connected to the thermal spreader via a slotted portion of the mechanically flexible substrate.

14. A magnetic pump assembly as claimed in claim 7, wherein said casing is constructed of ferrous material.

15. A magnetic pump for integration with a mechanically flexible thermal spreader, said magnetic pump comprising:
 a casing, the casing configured for being connected to a mechanically flexible substrate of the thermal spreader;
 a plurality of magnets, the plurality of magnets configured for being integrated with and at least partially enclosed by the casing, the plurality of magnets configured for applying a magnetic field to an electrically-conductive liquid, said magnets further configured for implementation with a plurality of electrodes, said electrodes being integrated within the mechanically flexible substrate for generating an electrical current flow through said liquid via a voltage applied across said electrodes, said magnets, in combination with said electrodes, configured for providing a pumping force for circulating the electrically-conductive liquid within an internal channel of an electrically-conductive cooling loop of the mechanically flexible substrate for promoting thermal conductivity of the thermal spreader,
 wherein the casing is configured with an input port and an output port, the casing being configured with a plurality of magnet flow channels, said magnet flow channels being located proximal to the output port, said magnet flow channels being further configured for allowing the electrically-conductive liquid to flow through the pump in a first direction, said casing being further configured with a plurality of channel walls, said channel walls configured for separating the magnet flow channels, said channel walls being configured for preventing the generated electrical current flow through said liquid from flowing in a direction generally perpendicular to the first direction, thereby promoting pumping power efficiency of the magnetic pump;
 wherein said magnetic flow channels are provided downstream from the plurality of magnets and the applied magnetic field when the casing is connected with the mechanically flexible substrate.

16. A magnetic pump assembly as claimed in claim 15, wherein the pump is a solid-state magnetic pump.

17. A magnetic pump assembly as claimed in claim 15, wherein the mechanically flexible thermal spreader is a low-profile thermal spreader at least partially constructed of organic materials.

18. A magnetic pump assembly as claimed in claim 15, wherein said casing is configured for fully containing the applied magnetic field when connected with said mechanically flexible substrate.

19. A magnetic pump assembly as claimed in claim 15, wherein said casing is constructed of ferrous material.

* * * * *